(12) United States Patent
Ishikawa et al.

(10) Patent No.: US 6,932,635 B2
(45) Date of Patent: Aug. 23, 2005

(54) ELECTRONIC COMPONENT TESTING SOCKET AND ELECTRONIC COMPONENT TESTING APPARATUS USING THE SAME

(75) Inventors: Takaji Ishikawa, Tokyo (JP); Hiroto Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/455,800

(22) Filed: Jun. 6, 2003

(65) Prior Publication Data
US 2004/0077200 A1 Apr. 22, 2004

Related U.S. Application Data

(63) Continuation of application No. PCT/JP01/10729, filed on Dec. 7, 2001.

(30) Foreign Application Priority Data

Dec. 7, 2000 (JP) .......................................... 2000-373614
Feb. 23, 2001 (JP) .......................................... 2001-049495

(51) Int. Cl.$^7$ ................................................. H01R 4/60
(52) U.S. Cl. ..................................... 439/190; 439/198
(58) Field of Search ................................ 439/190–192, 439/198

(56) References Cited

U.S. PATENT DOCUMENTS 5,335,553 A * 8/1994 Ueki et al. ................ 73/861.19
5,576,937 A * 11/1996 Kubo ......................... 361/820

FOREIGN PATENT DOCUMENTS

| JP | U-59-74729 | 5/1984 |
| JP | A-61-065173 | 4/1986 |
| JP | U-01-151266 | 10/1989 |
| JP | A-2001-051017 | 2/2001 |

* cited by examiner

*Primary Examiner*—Truc Nguyen
(74) *Attorney, Agent, or Firm*—Posz Law Group, PLC

(57) ABSTRACT

To control the temperature of an electronic component testing socket without mixing any noise into a test signal to be applied to an electronic component and a respond signal to be read from the electronic component when conducting a test on the electronic component, a first space 67 in the electronic component testing socket base 6 and a socket body inside space 75 in the electronic component testing socket 7 are connected via a gas outlet 65 and a gas inlet 76, and a second space 68 in the electronic component testing socket base 6 and a socket body inside space 75 in the electronic component testing socket 7 are connected via a gas inlet 66 and a gas outlet 77.

15 Claims, 28 Drawing Sheets

(a)

(b)

ELECTRONIC COMPONENT TESTING SOCKET AND ELECTRONIC COMPONENT TESTING APPARATUS USING THE SAME

This application is a con. of PCT/JP01/10729 filed Dec. 07, 2001.

BACKGROUND OF THE INVENTION

1. Field of the Invention

The present invention relates to an electronic component testing socket used for loading an electronic component to be tested in an electronic component testing apparatus for testing performance and functions of an electronic component, such as in IC device and an electronic component testing socket base used for mounting the electronic component testing socket. Also, the present invention relates to an electronic component testing unit wherein the electronic component testing socket is mounted on the electronic component testing socket base and an electronic component testing apparatus wherein the electronic component testing socket or an electronic component testing unit is mounted.

2. Description of the Related Art

In a production process of an electronic component, such as an IC device, an electronic component testing apparatus for testing performance and functions of a finally produced IC chip and a strip format IC device, etc. at its transition stage is necessary. As an example of such an electronic component testing apparatus, there is known an IC device testing apparatus for testing performance and functions of an IC device under a variety of thermal conditions, such as an ordinary temperature, low temperature and high temperature.

A test of an IC device using the IC device testing apparatus is for example conducted as described below. After transferring an IC device to be tested to above a test head provided with an IC socket, a connection terminal of the IC socket and an external terminal of the IC device to be tested are brought to contact each other by pressing the IC device to load on the IC socket. As a result, the IC device to be tested is electrically connected to a testing main device via the test head and a cable. Then, a test signal supplied from the testing main device to the test head via the cable is applied to the IC device to be tested, and by sending a response signal read from the IC device to be tested to the testing main device via the test head and the cable, electronic characteristic of the IC device to be tested is measured.

A thermal stress of a low temperature and high temperature is applied to the IC device to be tested in the IC device test. As a method of giving a thermal stress to the IC device to be tested, for example, a method of covering the test head provided with the IC socket and controlling the temperature in the chamber, and a method of heating or cooling the IC device to be tested in advance before transferring the same into the test head are used.

Also, in the IC device test, it is necessary to heat or cool the IC socket for loading the IC device to be tested while heating and cooling the IC device to be tested so as to apply a thermal stress. It is because when there is a temperature difference between the IC device to be tested and the IC socket, a heat transfer arises between the two at the time of loading the IC device on the IC socket and the thermal stress given to the IC device may be eased. Also, when a degree of thermal expansion or thermal contraction is different between the IC device and the IC socket, the external terminal of the IC device does not accurately the connection terminal of the IC socket at the time of loading the IC device on the IC socket and contact credibility of the two may be lost. Particularly, when the IC device to be tested is a large sized IC device, such as a strip format IC device, an effect of thermal expansion and thermal contraction is widely different, so that it is necessary to heat or cool the IC socket together with the IC device to be tested to secure the contact credibility of the IC device and the IC socket.

When applying a thermal stress to the IC device to be tested, in the case of using a method of covering the test head provided with the IC socket with a chamber to control the temperature in the chamber, the IC device to be tested and the IC socket are both arranged in the chamber, so that the IC device and the IC sockets are heated and cooled together. However, since a lower side (a test head side) of the socket board on which the IC socket is mounted is exposed to an outside air, there arises a heat transfer between the IC device and the socket board so that the thermal stress applied to the IC device is liable to be eased.

Thus, a method of considering the thermal stress on the IC device being eased to set the temperature in the chamber to be able to make up in advance and a method of circulating the air in the chamber to the lower side of the socket board, etc. are used.

On the other hand, when applying a thermal stress to the IC device to be tested by a method of heating or cooling the IC device in advance of transferring the same to the test head, it is necessary to heat or cool the IC socket by a different method therefrom.

A method of heating or cooling a socket guide by providing a heat source (for example, an electric heater) or a cool source (for example, a Peltier element) to heat or cool the IC socket is used. For example, a method of burying a heating wire in the socket guide and generating heat by applying a current into the heating wire to heat the IC socket is used.

SUMMARY OF THE INVENTION

In the case of considering a thermal stress being eased on the IC device to be tested to set the temperature in the chamber to make up for the loss in advance, however, although a desired thermal stress can be applied to the IC device under testing, an excessive thermal stress is given to an IC device standing by in the chamber, so that the contact credibility of the IC device to be tested and the IC socket cannot be maintained.

Also, when circulating an air in the chamber to the lower side of the socket board, there are much physical obstacles, such as, many cables and board under the socket board, so it is difficult to circulate the air in the chamber thereto and it becomes costly when trying to forcibly circulate the air. Also, since the space under the mother board became a low temperature, there arises dew condensation on the lower side of the mother board when circulating the air in the chamber between the socket board and the mother board. To prevent the condensation, the mother board has to be sealed or a dry air has to be injected to the lower side of the mother board, which ends up in the complicated configuration.

Further, when providing a heat source or a cool source using electricity to the socket guide mounted on the IC socket, in the IC device test, the performance and function of the IC device to be tested are tested by applying a test signal to the IC device and reading a response signal from the IC device, and if a noise generated from an effect of electricity used by the heat source or cool source mixes in the test signal to be tested to the IC device and the respond signal read from the IC device, accuracy of the test declines or the test may not be able to be continued under some circumstances.

An object of the present invention is to provide an electronic component testing socket capable of efficiently controlling the temperature of an electronic component testing socket, such as an IC socket, without mixing any noise in a test signal to be applied to the electronic component, such as an IC device, and a respond signal to be read from the electronic component, such as an IC device, by using a temperature controlled gas, an electronic component testing socket base, an electronic component testing unit, an electronic component testing apparatus, and a method of controlling the temperature of the electronic component testing socket. Note that in the present specification, the words "to control the temperature of the electronic component testing socket" are meant to include both maintaining and changing the temperature of the electronic component testing socket to be a desired temperature.

To attain the above object, a method of controlling the temperature of an electronic component testing socket, electronic component testing socket base, electronic component testing unit, electronic component testing apparatus and electronic component testing socket provided by the present invention is characterized in the following points.

(1) According to the present invention, there is provided an electronic component testing socket, comprising a connection terminal able to be connected to an external terminal of an electronic component to be tested and a socket body for holding the connection terminal, wherein the socket body is provided with a gas inlet and a gas outlet connected to a space formed therein.

In the electronic component testing socket of the present invention, a gas outside the electronic component testing socket can be flown from the gas inlet provided on the socket body to a space formed inside the socket body (hereinafter, also referred to as "a space inside a socket body") and a gas in the space inside the socket body can be flown from the gas outlet provided on the socket body to outside the electronic component testing socket.

Accordingly, by using the electronic component testing socket of the present invention, a temperature adjusted gas (for example a gas heated or cooled to a desired temperature) (hereinafter, also referred to as "a thermoregulated gas") can be successively or intermittently flown from the gas inlet of the socket body to the space inside the socket body and the temperature of the electronic component testing socket can be controlled via a heat transfer of the thermoregulated gas in the space inside the socket body and the electronic component testing socket.

Also, by using the electronic component testing socket of the present invention, the electronic component testing socket can be heated or cooled by using a thermoregulated gas as a medium, consequently, the temperature of the electronic component testing socket can be controlled without mixing any noise into a test signal to be applied to an electronic component loaded on the electronic component testing socket and a respond signal to be read from the electronic component.

(2) According to the present invention, there is provided an electronic component testing socket base, comprising a base body and a socket board provided on top of the base body, wherein the electronic component testing socket base is provided with a space therein, the base body is provided with a gas inlet or a gas outlet connected to the space, and the socket board is provided with a gas outlet or a gas inlet connected to the space.

In the first electronic component testing socket base of the present invention, the base body and the socket board are provided with one or both of a gas inlet and gas outlet, and an opening formed on the base body and an opening formed on the socket board are made to include different kind. For example, when a gas inlet is formed on the base body, at least a gas outlet is formed on the socket board, while when a gas outlet is formed on the base body, at least a gas inlet is formed on the socket board.

In the first electronic component testing socket base of the present invention, a gas outside the electronic component testing socket base can be flown from the gas inlet provided on the base body or the socket board to a space formed inside the electronic component testing socket base (hereinafter, also referred to as "a space inside a base"), and a gas inside the space inside the base can be flown out from the gas outlet provided on the socket board or base body to outside the electronic component testing socket base.

Accordingly, by using the first electronic component testing socket base of the present invention, the temperature of the electronic component testing socket of the present invention can be controlled without mixing any noise into a test signal to be applied to the electronic component loaded on the electronic component testing socket of the present invention and a respond signal to be read from the electronic component according to a mechanism explained later on.

Also, by using the first electronic component testing socket base of the present invention, since the temperature of the electronic component testing socket of the present invention can be controlled by connecting a gas outlet of the socket board to a gas inlet of the socket body or by connecting a gas inlet of the socket board to a gas outlet of the socket body according to a mechanism explained later on, the electronic component testing socket can be easily attached and removed even in a state where the first electronic component testing socket base of the present invention is fixed.

(3) According to the present invention, there is provided an electronic component testing socket base, comprising a base body and a socket board provided on top of the base body, wherein the electronic component testing socket base is provided with a first space and a second space therein, the base body is provided with a gas inlet connected to the first space and a gas outlet connected to the second space, and the socket board is provided with a gas outlet connected to the first space and a gas inlet connected to the second space.

In the second electronic component testing socket base of the present invention, a gas outside the electronic component testing socket base can be flown from the gas inlet provided on the base body to the first space formed inside the electronic component testing socket base (hereinafter, also simply referred to as "a first space") and a gas in the first space can be flown from the gas outlet provided on the socket board to outside the electronic component testing socket base, and furthermore, a gas outside the electronic component testing socket base can be flown from the gas inlet provided on the socket board to a second space formed inside the electronic component testing socket base (hereinafter, also simply referred to as "a second space") and a gas inside the second space can be flown from the gas outlet provided on the base body to outside the electronic component testing socket base.

Accordingly, by using the second electronic component testing socket base of the present invention, the temperature of the electronic component testing socket of the present invention can be controlled without mixing any noise into a test signal to be applied to an electronic component loaded on the electronic component testing socket of the present invention and a respond signal to be read from the electronic component according to a mechanism explained later on.

Also, by using the second electronic component testing socket base of the present invention, since the temperature of the electronic component testing socket of the present invention can be controlled by connecting a gas outlet on the socket board to a gas inlet on the socket body and connecting a gas inlet on the socket board to a gas outlet on the socket body according to a mechanism explained later on, the electronic component testing socket of the present invention can be easily attached or removed even in a state where the second electronic component testing socket base of the present invention is fixed.

(4) According to the present invention, there is provided an electronic component testing unit comprising the electronic component testing socket base of the present invention and the electronic component testing socket of the present invention mounted on the socket board of the electronic component testing socket base, wherein the space formed inside the electronic component testing socket base and the space formed inside the electronic component testing socket are connected through the gas outlet provided on the socket board and the gas inlet provided on the socket body of the electronic component testing socket.

In the first electronic component testing unit of the present invention, a gas flown from the gas inlet on the base body to the space inside the base can be flown out from the gas outlet on the socket board and then flown from the gas inlet of the socket body to the space inside the socket body, and a gas in the space inside the socket body can be flown out from the gas outlet on the socket body.

Accordingly, by using a first electronic component testing unit of the present invention, by supplying a thermoregulated gas from the gas inlet on the base body to the space inside the base, the thermoregulated gas can be flown to the space inside the socket body via the gas outlet on the socket board and the gas inlet on the socket body, and the temperature of the electronic component testing socket can be controlled via a heat transfer of the thermoregulated gas in the space inside the socket body and the electronic component testing socket.

Also, by using the first electronic component testing unit of the present invention, the electronic component testing socket can be heated or cooled by using a thermoregulated gas as a medium, so the temperature of the electronic component testing socket can be controlled without mixing any noise into a test signal to be applied to an electronic component loaded on the electronic component testing socket and a respond signal read from the electronic component.

(5) According to the present invention, there is provided an electronic component testing unit comprising the electronic component testing socket base of the present invention and the electronic component testing socket of the present invention mounted on the socket board of the electronic component testing socket base, wherein the space formed inside the electronic component testing socket base and the space formed inside the electronic component testing socket are connected through the gas inlet provided on the socket board and the gas outlet provided on the socket body of the electronic component testing socket.

In the second electronic component testing unit of the present invention, a gas flown from the gas inlet on the socket body to the space inside the socket body can be flown out from the gas outlet on the socket body and then flown from the gas inlet on the socket board to the space inside the base, and a gas in the space inside the base can be flown out from the gas outlet of the base body.

Accordingly, by using the second electronic component testing unit of the present invention, by supplying a thermoregulated gas from the gas inlet on the socket body to the space inside the socket body, the thermoregulated gas can be flown to the space inside the base via the gas outlet on the socket body and the gas inlet on the socket board, and the temperature of the electronic component testing socket can be controlled via a heat transfer of the thermoregulated gas in the space inside the socket body and the electronic component testing socket.

Also, by using the second electronic component testing unit of the present invention, the electronic component testing socket can be heated or cooled by using a thermoregulated gas as a medium, so the temperature of the electronic component testing socket can be controlled without mixing any noise into a test signal to be applied to an electronic component loaded on the electronic component testing socket and a respond signal to be read from the electronic component.

(6) According to the present invention, there is provided an electronic component testing unit comprising the electronic component testing socket base of the present invention and the electronic component testing socket of the present invention mounted on the socket board of the electronic component testing socket base, wherein the first space formed inside the electronic component testing socket base and the space formed inside the electronic component testing socket are connected through the gas outlet provided on the socket board and the gas inlet provided on the socket body of the electronic component testing socket, and the second space formed inside the electronic component testing socket base and the space formed inside the electronic component testing socket are connected through the gas inlet provided on the socket board and the gas outlet provided on the socket body of the electronic component testing socket.

In the third electronic component testing unit of the present invention, a gas flown from the gas inlet on the base body to the first space can be flown out from the gas outlet on the socket board and then flown from the gas inlet on the socket body to the space inside the socket body, and a gas in the space inside the socket body flown out from the gas outlet on the socket body can be flown from the gas inlet on the socket board to the second space and then flown out from the gas outlet on the base body.

Accordingly, by using the third electronic component testing unit of the present invention, by supplying a thermoregulated gas from the gas inlet on the base body to the first space, the thermoregulated gas can be flown to the space inside the socket body via the gas outlet on the socket board and the gas inlet on the socket body, and the temperature of the electronic component testing socket can be controlled via a heat transfer of the thermoregulated gas in the space inside the socket body and the electronic component testing socket.

Also, by using the third electronic component testing unit of the present invention, the electronic component testing socket can be heated or cooled by using a thermoregulated gas as a medium, so the temperature of the electronic component testing socket can be controlled without mixing any noise into a test signal to be applied to an electronic component loaded on the electronic component testing socket and a respond signal to be read from the electronic component.

(7) According to the present invention, there is provided an electronic component testing apparatus, comprising the electronic component testing socket of the present invention and a gas supplier capable of supplying a thermoregulated gas from the gas inlet provided on the socket body of the electronic component testing socket to the space formed inside the electronic component testing socket.

In the first electronic component testing apparatus of the present invention, a thermoregulated gas supplied by a gas supplier can be flown from the gas inlet on the socket, body to the space inside the socket body.

(8) According to the present invention, there is provided an electronic component testing apparatus, comprising a chamber, the electronic component testing socket of the present invention arranged in the chamber and a gas supplier capable of supplying a gas in the chamber from the gas inlet provided on the socket body of the electronic component testing socket to the space formed inside the electronic component testing socket.

In the second electronic component testing apparatus of the present invention, a thermoregulated gas in the chamber supplied by a gas supplier can be flown from the gas inlet on the socket body to the space inside the socket body.

(9) According to the present invention, there is provided an electronic component testing apparatus, comprising a chamber, the electronic component testing socket of the present invention arranged in the chamber and a gas aspirator capable of aspirating a gas in the space formed inside the electronic component testing socket from the gas outlet provided on the socket body of the electronic component testing socket.

In the third electronic component testing apparatus of the present invention, since the electronic component testing socket is arranged inside the chamber, the thermoregulated gas in the chamber can be flown from the gas inlet on the socket body to the space inside the socket body when a gas in the space inside the socket body is aspirated by the gas aspirator.

(10) According to the present invention, there is provided an electronic component testing apparatus, comprising an electronic component testing unit of the present invention and a gas supplier capable of supplying a thermoregulated gas from the gas inlet provided on the base body of the electronic component testing socket base of the electronic component testing unit to the space formed inside the electronic component testing socket base.

In the fourth electronic component testing apparatus of the present invention, a thermoregulated gas supplied by the gas supplier can be flown from the gas inlet on the base body to the space inside the base, and then flown to the space inside the socket body via the gas outlet on the socket board and the gas inlet on the socket body.

(11) According to the present invention, there is provided an electronic component testing apparatus, comprising a chamber, the electronic component testing unit of the present invention arranged in the chamber and a gas supplier capable of supplying a gas in the chamber from the gas inlet provided on the base body of the electronic component testing socket base of the electronic component testing unit to the space formed inside the electronic component testing socket base.

In the fifth electronic component testing apparatus of the present invention, a thermoregulated gas in the chamber supplied by the gas supplier can be flown from the gas inlet on the base body to the space inside the base, and then flown to the space inside the socket body via the gas outlet on the socket board and the gas inlet on the socket body.

(12) According to the present invention, there is provided an electronic component testing apparatus, comprising the electronic component testing unit of the present invention and a gas aspirator capable of aspirating a gas in the space formed inside the electronic component testing socket base from the gas outlet provided on the base body of electronic component testing socket base of the electronic component testing unit.

In the sixth electronic component testing apparatus of the present invention, when a gas in the space inside the base is aspirated from the gas outlet on the base body by the gas aspirator, a thermoregulated gas outside the electronic component testing socket can be flown from the gas inlet on the socket body to the space inside the socket body.

(13) According to the present invention, there is provided an electronic component testing apparatus, comprising a chamber, the electronic component testing unit of the present invention arranged in the chamber and a gas aspirator capable of aspirating a gas in the space formed inside the electronic component testing socket base from the gas outlet provided on the base body of the electronic component testing socket base of the electronic component testing unit.

In the seventh electronic component testing apparatus of the present invention, when a gas in the space inside the base is aspirated from the gas outlet on the base body by the gas aspirator, a thermoregulated gas in the chamber can be flown from the gas inlet on the socket body to the space inside the socket body.

(14) According to the present invention, there is provided an electronic component testing apparatus, comprising the electronic component testing unit of the present invention and a gas supplier capable of supplying a thermoregulated gas from the gas inlet provided on the base body of the electronic component testing socket base of the electronic component testing unit to the first space formed inside the electronic component testing socket base.

In the eighth electronic component testing apparatus of the present invention, a thermoregulated gas supplied by the gas supplier can be flown from the gas inlet on the base body to the first space and then flown to the space inside the socket body via the gas outlet on the socket board and the gas inlet on the socket body.

(15) According to the present invention, there is provided an electronic component testing apparatus, comprising a chamber, the electronic component testing unit of the present invention arranged in the chamber and a gas supplier capable of supplying a gas in the chamber from the gas inlet provided on the base body of the electronic component testing socket base of the electronic component testing unit to the first space formed inside the electronic component testing socket base.

In the ninth electronic component testing apparatus of the present invention, a thermoregulated gas in the chamber supplied by the gas supplier can be flown from the gas inlet on the base body to the first space and then flown to the space inside the socket body via the gas outlet on the socket board and the gas inlet on the socket body.

(16) According to the present invention, there is provided an electronic component testing apparatus, comprising the electronic component testing socket of the present invention, a socket guide provided to the electronic component testing socket, a pusher capable of pushing an electronic component loaded on the electronic component testing socket in a direction of a connection terminal of the electronic component testing socket and a gas supplier, wherein the socket guide has a gas inlet provided on the guide bush and a gas outlet connecting to the gas inlet through a gas flow path, the gas outlet of the socket guide is connected to the space formed inside the electronic component testing socket through the gas inlet provided on the socket body of the electronic component testing socket, the pusher has a gas outlet provided on the guide pin and a gas inlet connected to the gas outlet through a gas flow path, when the guide pin of the pusher fits in the guide bush of the socket guide, the gas inlet of the pusher and the space formed inside the electronic component testing socket are connected, and when the guide pin of the pusher fits in the guide bush of the socket guide, the gas supplier is capable of supplying a thermoregulated gas from the gas inlet of the pusher to the space formed inside the electronic component testing socket.

In the tenth electronic component testing apparatus of the present invention, when the guide pin of the pusher fits in the guide bush of the socket guide, the gas inlet on the pusher is connected to the space formed inside the electronic component testing socket, so a thermoregulated gas supplied by the gas supplier can be flown from the gas inlet of the pusher to the space inside the socket body.

(17) According to the present invention, there is provided an electronic component testing apparatus of the present invention further comprising a chamber, wherein the electronic component testing socket is arranged in the chamber and the gas supplier is capable of supplying a gas in the chamber from the gas inlet of the pusher to the space formed inside the electronic component testing socket.

In the eleventh electronic component testing apparatus of the present invention, when the guide pin of the pusher fits in the guide bush of the socket guide, the gas inlet on the pusher is connected to the space formed inside the electronic component testing socket, so a thermoregulated gas in the chamber supplied by the gas supplier can be flown from the gas inlet of the pusher to the space inside the socket body.

(18) According to the present invention, there is provided an electronic component testing apparatus, comprising the electronic component testing socket of the present invention, a socket guide provided to the electronic component testing socket, a pusher capable of pushing an electronic component loaded on the electronic component testing socket in a direction of connection terminal of the electronic component testing socket and a gas aspirator, wherein the socket guide has a gas outlet provided on the guide bush and a gas inlet connected to the gas outlet through a gas flow path, the gas inlet of the socket guide is connected to the space formed inside the electronic component testing socket through the gas outlet provided on the socket body of the electronic component testing socket, the pusher has a gas inlet provided on the guide pin and a gas outlet connected to the gas inlet through a gas flow path, when the guide pin of the pusher fits in the guide bush of the socket guide, the gas outlet of the pusher is connected to the space formed inside the electronic component testing socket, and when the guide pin of the pusher fits in the guide bush of the socket guide, the gas aspirator is capable of aspirating a gas in the space formed inside the electronic component testing socket from the gas outlet of the pusher.

In the twelfth electronic component testing apparatus of the present invention, when the guide pin of the pusher fits in the guide bush of the socket guide, the gas outlet on the pusher is connected to the space inside the socket body, so when a gas in the space inside the socket body is aspirated from the gas outlet on the pusher by the gas aspirator, a thermoregulated gas outside the electronic component testing socket can be flown from the gas inlet on the socket body to the space inside the socket body.

(19) According to the present invention, there is provided an electronic component testing apparatus of the present invention further comprising a chamber, wherein the electronic component testing socket is arranged in the chamber.

In the thirteenth electronic component testing apparatus of the present invention, when the guide pin of the pusher fits in the guide bush of the socket guide, the gas outlet on the pusher is connected to the space inside the socket body, so when a gas in the space inside the socket body is aspirated from the gas outlet on the pusher by the gas aspirator, a thermoregulated gas in the chamber can be flown from the gas inlet on the socket body to the space inside the socket body.

By using the first to thirteenth electronic component testing apparatus of the present invention, the temperature of the electronic component testing socket can be controlled by a thermoregulated gas, so a test can be conducted on an electronic component loaded on the electronic component testing socket while controlling the temperature of the electronic component testing socket without mixing any noise into a test signal to be applied to the electronic component loaded on the electronic component testing socket and a respond signal to be read from the electronic component.

Also, when the electronic component testing socket itself is arranged in the chamber, the temperature of the electronic component testing socket can be more efficiently controlled. Furthermore, when using a thermoregulated gas in the chamber for controlling the temperature of the electronic component testing socket, a cost reduction can be attained.

In the first to thirteenth electronic component testing apparatus of the present invention, the gas supplier or the gas aspirator may be attached to the gas inlet or the gas outlet directly or via other member. For example, in the case where the electronic component testing socket of the present invention is provided with the socket guide, the socket guide has a gas inlet and a gas outlet connected to the gas inlet via a gas flowing path, and the gas inlet of the socket guide is connected to the space inside the socket body via the gas flowing path of the socket guide, the gas outlet of the socket guide and the gas inlet of the socket body, a thermoregulated gas can be supplied to the space inside the socket body by attaching the gas supplier to the gas inlet of the socket guide.

(20) According to the present invention, there is provided a method of controlling a temperature of an electronic component testing socket by repeating a supply of a thermoregulated gas to a space formed inside the electronic component testing socket and a discharge of a gas from the space.

In the method of controlling the temperature of the electronic component testing socket of the present invention, the electronic component testing socket can be heated or cooled by using a thermoregulated gas as a medium, so the temperature of the electronic component testing socket can be controlled without mixing any noise into a test signal to be applied to the electronic component loaded on the electronic component testing socket and a respond signal to be read from the electronic component.

Also, in the method of controlling the temperature of the electronic component testing socket of the present invention, by controlling the temperature of the electronic component testing socket so as to be the same temperature or approximately the same temperature as that of the electronic component to be tested, a reduction of the thermal stress given to the electronic component which can be occurred at the time of loading the electronic component to be tested on the electronic component testing socket can be suppressed.

Furthermore, in the method of controlling the temperature of the electronic component testing socket of the present invention, contact credibility of the external terminal of the electronic component to be tested and the connection terminal of the electronic component testing socket can be assured by controlling the temperature of the electronic component testing socket so that the same or approximately the same heat expansion or heat contraction as that occurring to the electronic component to be tested occurs to the electronic component testing socket.

At this time, when the coefficient of heat expansion or heat contraction of the electronic component to be tested and that of the electronic component testing socket are the same or approximately the same, the temperature of the electronic component testing socket is controlled to be the same or approximately the same temperature of the electronic component. Accordingly, in this case, the contact credibility of the external terminal of the electronic component to be tested and the connection terminal of the electronic component testing socket can be assured, and at the same time, it is possible to suppress a reduction of thermal stress given to the electronic component which might occur at the time of loading the electronic component on the electronic component testing socket. On the other hand, when the coefficient of heat expansion or heat contraction of the electronic component to be tested and that of the electronic component testing socket are different, the temperature of the electronic component testing socket is controlled to the a different temperature from that of the electronic component to be tested. Accordingly, in this case, it is preferable to separately provide a means to give a thermal stress to the electronic component loaded on the electronic component testing socket so as to suppress the reduction of the thermal stress given to the electronic component.

Furthermore, in the method of controlling the temperature of the electronic component testing socket of the present invention, since it is possible to successively or intermittently flow a thermoregulated gas to the space formed inside the electronic component testing socket, it makes the electronic component testing socket hard to be affected by a temperature change due to a heat transfer via the contact portion with the outside (for example, an outside air), and thereby, the temperature of the electronic component testing socket can be accurately controlled.

The method of controlling the temperature of the electronic component testing socket of the present invention can be embodied by using the electronic component testing socket, the electronic component testing socket base, the electronic component testing unit or the electronic component testing apparatus of the present invention. Also, the method of controlling the temperature of the electronic component testing socket of the present invention is particularly useful for the case where the electronic component to be tested is a large-sized IC device, such as a strip format IC device, that is, the case where heat expansion or heat contraction largely affects the contact credibility of the external terminal of the electronic component to be tested and the connection terminal of the electronic component testing socket.

Note that in the present invention, "a gas inlet" is an opening by which a gas can be flown into a predetermined space, "a gas outlet" is an opening by which a gas can be flown out from a predetermined space, the gas inlet and the gas outlet have a common point of connecting to a predetermined space directly or via a gas flowing path, and the opening connected to the predetermined space can be a gas inlet and also a gas outlet. Namely, the gas inlet can be a gas outlet, while a gas outlet can be a gas inlet.

BRIEF DESCRIPTION OF THE DRAWINGS

These and other objects and features of the present invention will become clearer from the following description of the preferred embodiments given with reference to the attached drawings, in which.

DESCRIPTION OF THE PREFERRED EMBODIMENTS

Below, an embodiment of the present invention will be explained based on the drawings.

First Embodiment

An embodiment of a chamberless type (a heat plate type) will be explained as a first embodiment of the present invention based on the drawings.

Figure 1:
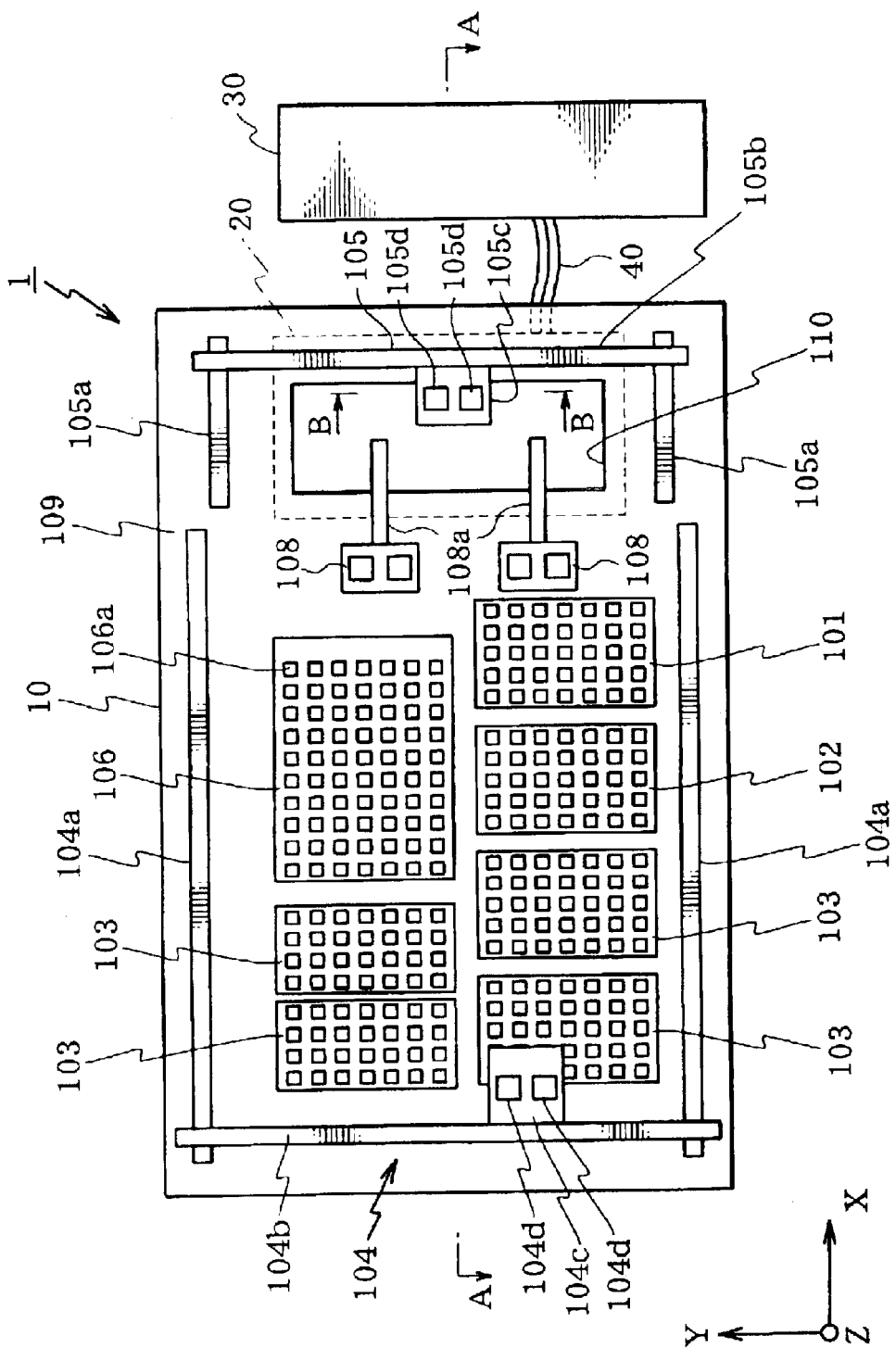
FIG. 1 is a plan view of an embodiment of an electronic component testing apparatus wherein an electronic component testing unit according to the present invention is applied.
Figure 2:
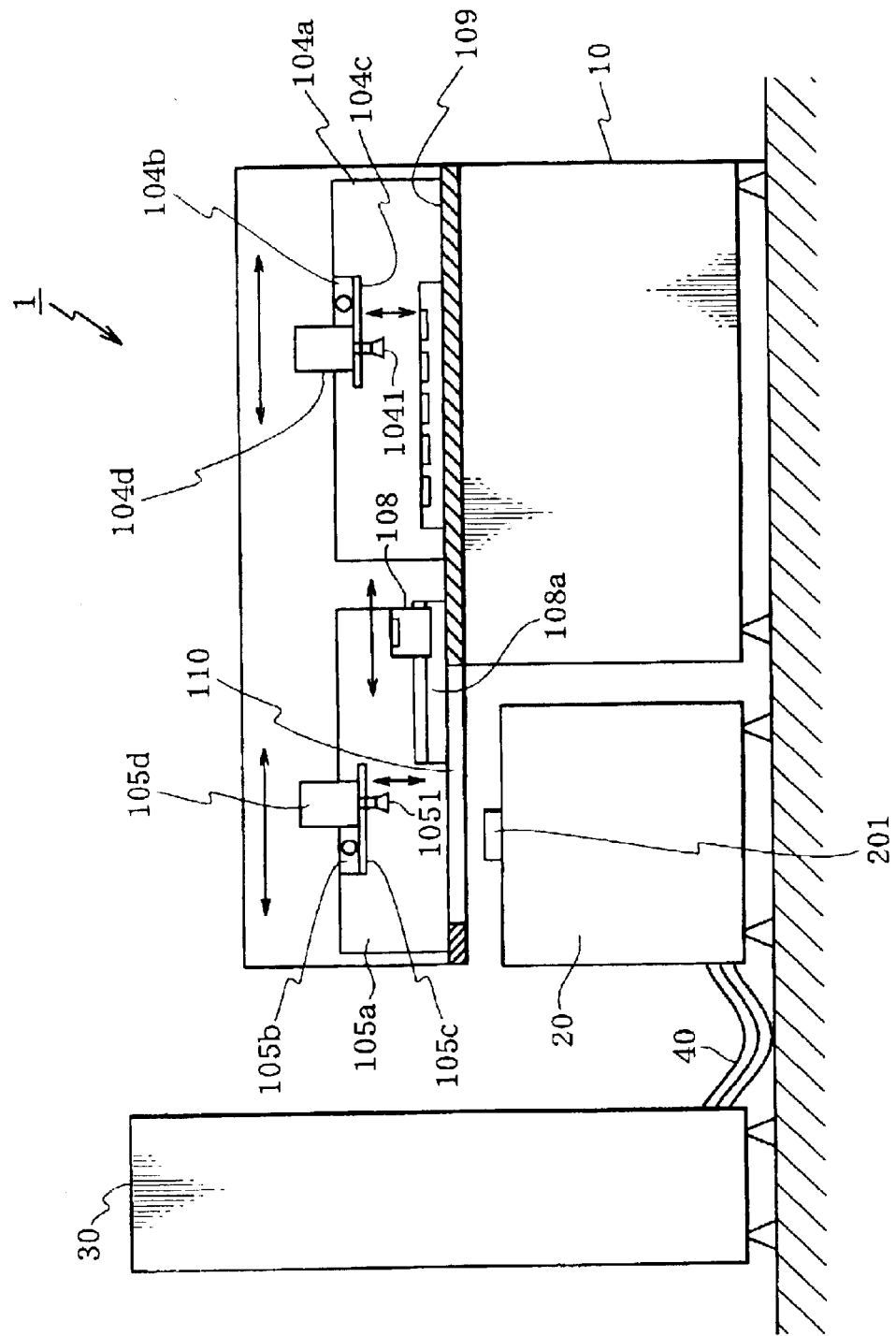
FIG.2 is a cross sectional view along the line A—A in FIG 1.
Figure 3:
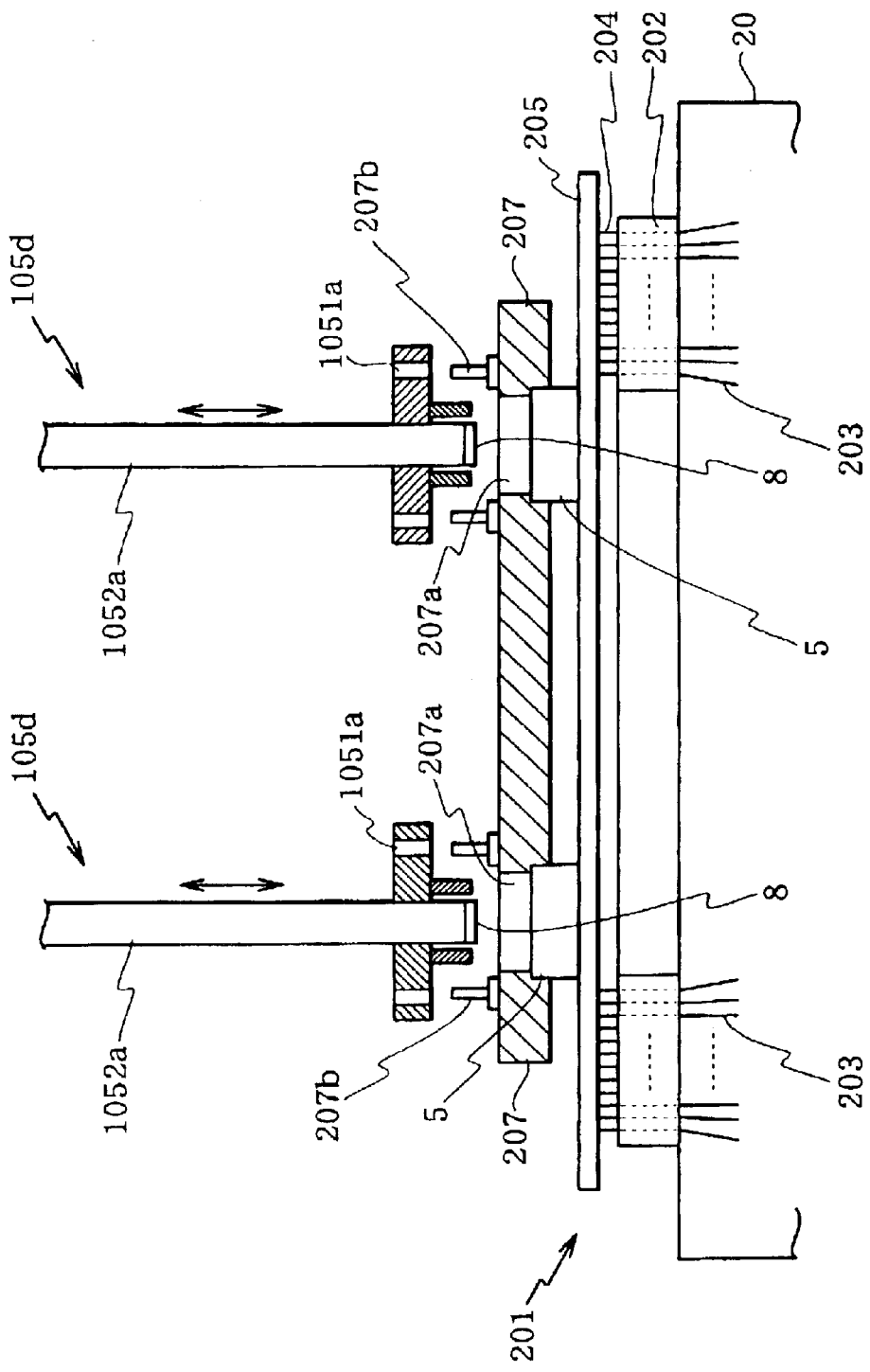
FIG. 3 is a cross sectional view (a cross sectional view along the line B—B in FIG. 1) of a contact section of the test head in detail.
Figure 4:
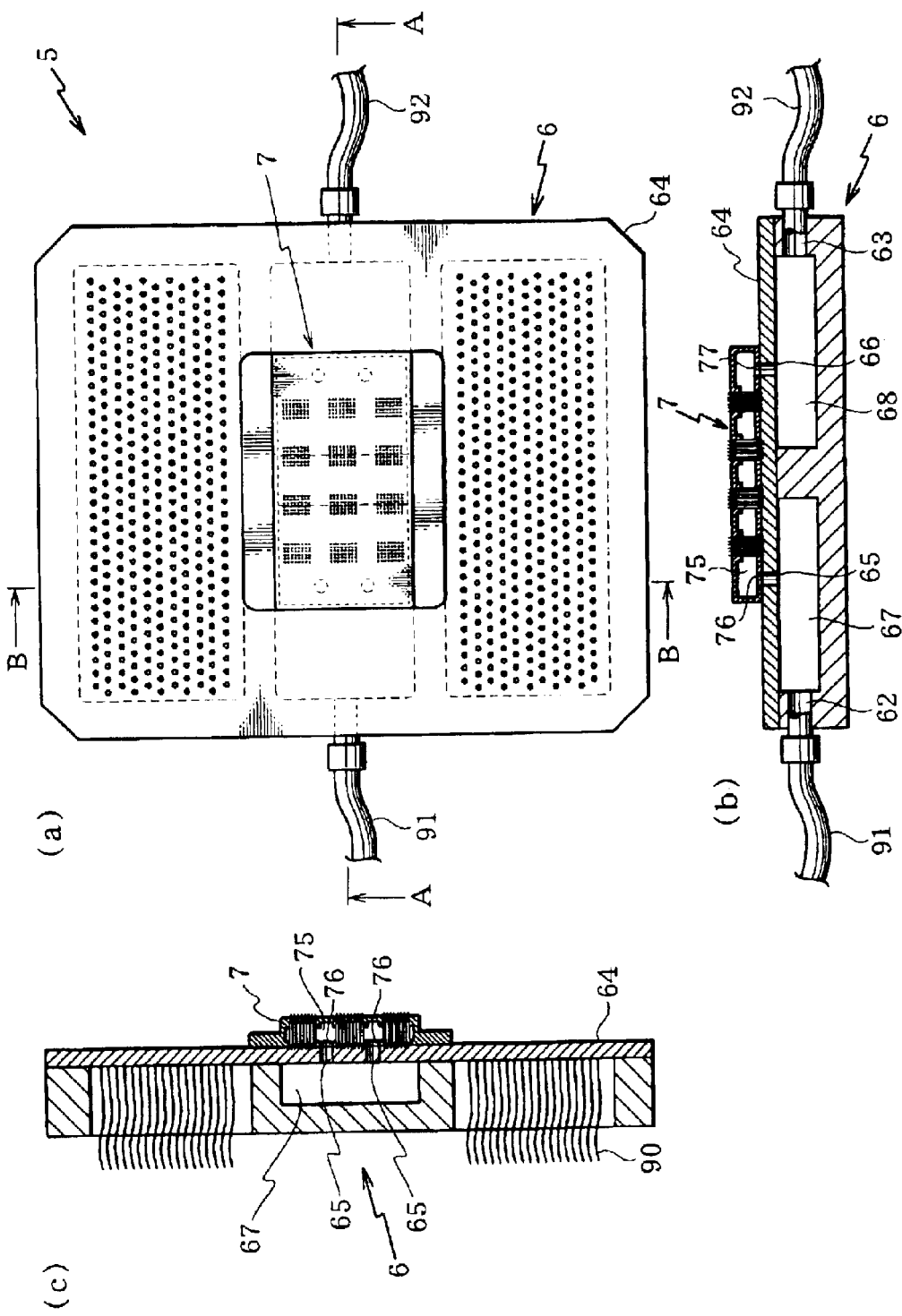
FIG. 4(a) is a view from above of an embodiment of an electronic component testing unit according to the present invention.
FIG. 4(b) is a cross sectional view along the line A—A in FIG. 4(a)
FIG. 4(c) is a cross sectional view along the line B—B in FIG. 4(a)
Figure 5:
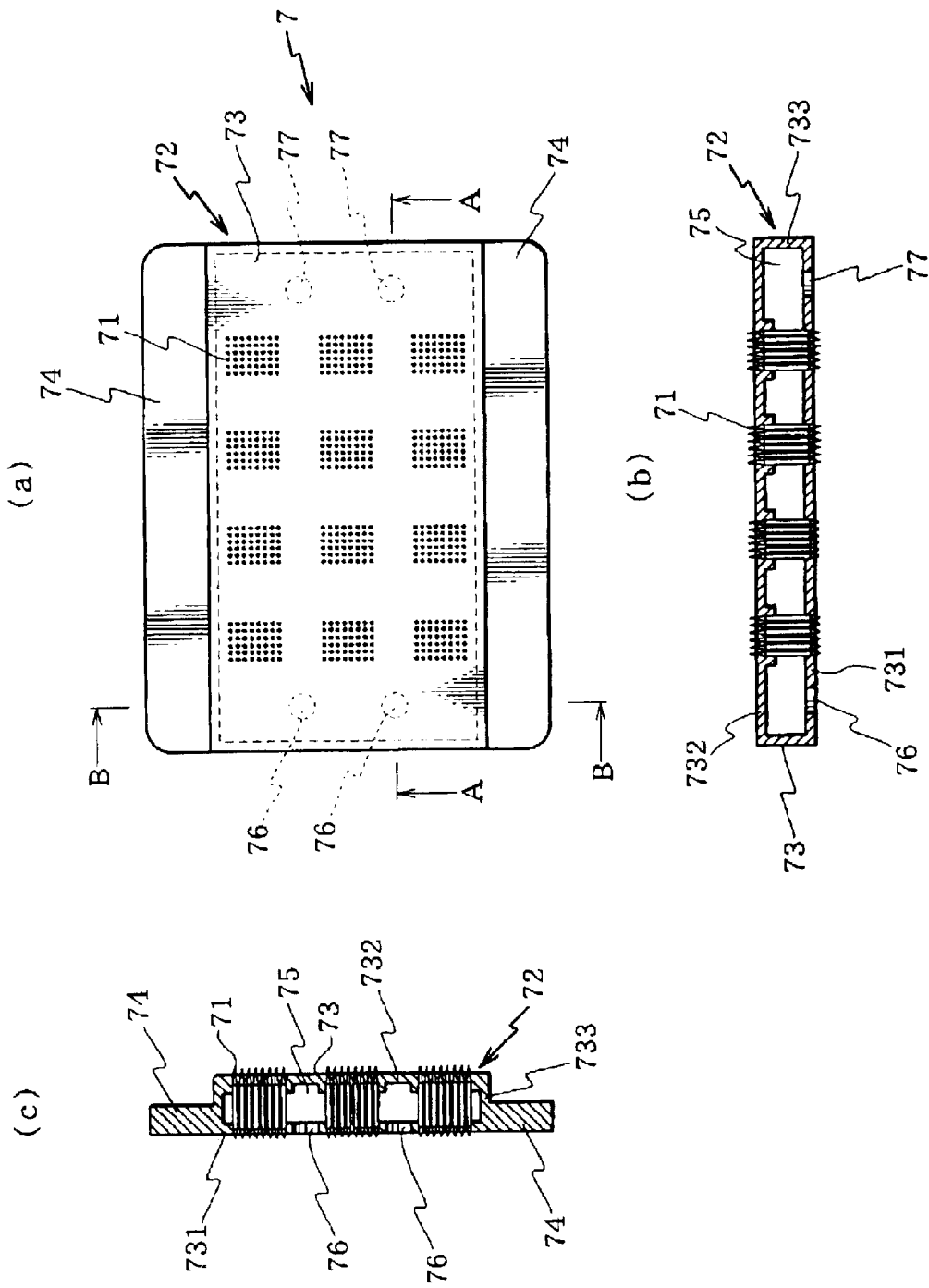
FIG. 5(a) is a view from above of an embodiment of an electronic component testing socket according to the present invention.
FIG. 5(b) is a cross sectional view along the line A—A in FIG. 5(a)
FIG. 5(c) is a cross sectional view along the line B—B in FIG. 5(a)
Figure 6:
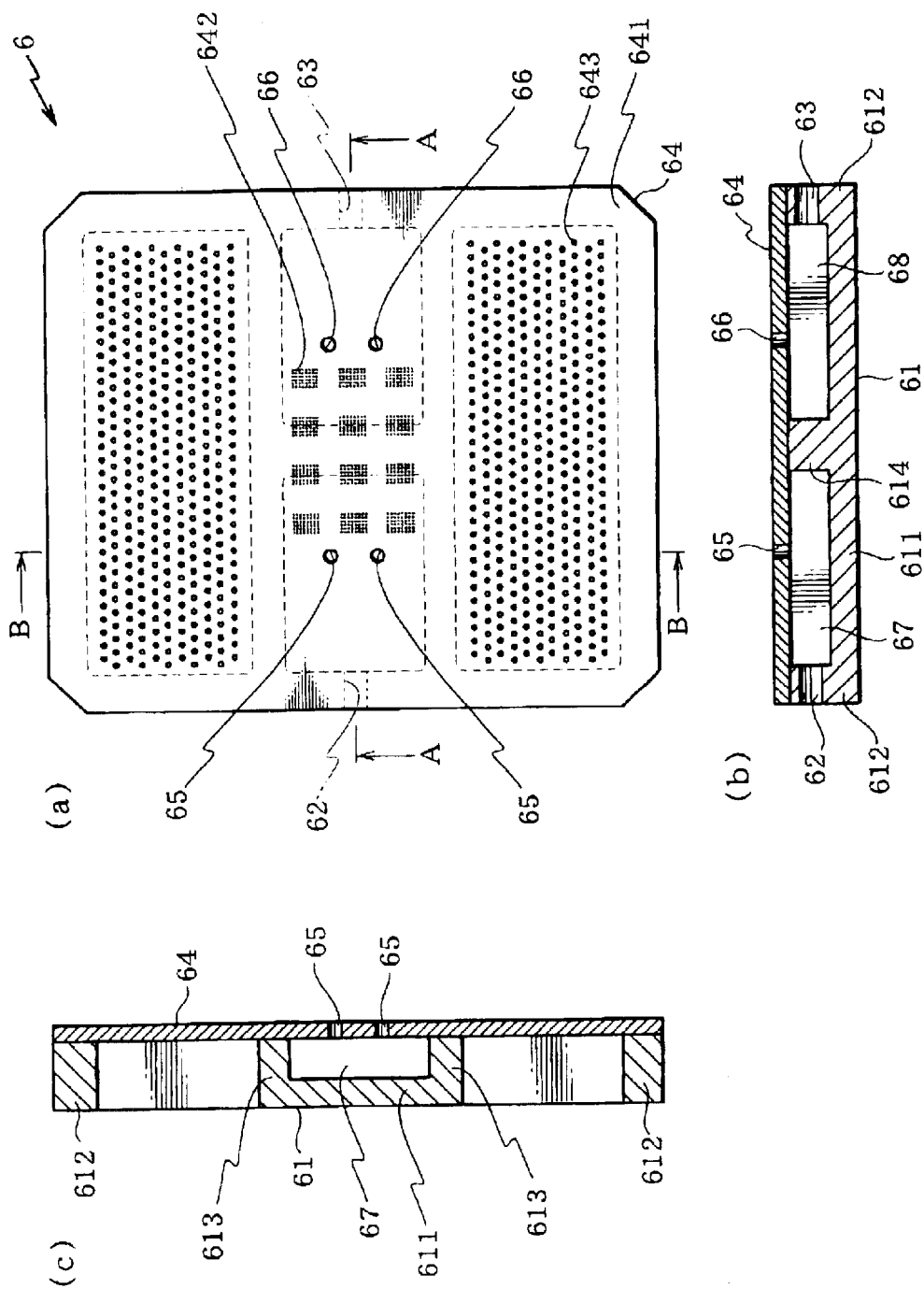
FIG. 6(a) is a view from above of an embodiment of an electronic component testing socket base according to the present invention.
FIG. 6(b) is a cross sectional view along the line A—A in FIG. 6(a) and FIG. 6(c) is a cross sectional view along the line B—B in FIG. 6(a)

FIG. 1 is a plan view of an embodiment of an electronic component testing apparatus wherein an electronic component testing unit according to the present invention is applied, FIG. 2 is a cross sectional view along the line A—A in FIG. 1, FIG. 3 is a cross sectional view (a cross sectional view along the line B—B in FIG. 1) of a contact section of the test head in detail, FIG. 4(a) is a view from above of an embodiment of an electronic component testing unit according to the present invention, FIG. 4(b) is a cross sectional view along the line A—A in FIG. 4(a), FIG. 4(c) is a cross sectional view along the line B—B in FIG. 4(a), FIG. 5(a) is a view from above of an embodiment of an electronic component testing socket according to the present invention, FIG. 5(b) is a cross sectional view along the line A—A in FIG. 5(a), FIG. 5(c) is a cross sectional view along the line B—B in FIG. 5(a), FIG. 6(a) is a view from above of an embodiment of an electronic component testing socket base according to the present invention, FIG. 6(b) is a cross sectional view along the line A—A in FIG. 6(a) and FIG. 6(c) is a cross sectional view along the line B—B in FIG. 6(a).

As shown in FIG. 1 and FIG. 2, an electronic component testing apparatus 1 according to the present embodiment comprises a handler 10, a test head 20 and a testing main device 30, and the test head 20 and the testing main device 30 are electrically connected via a cable 40.

In the electronic component testing apparatus 1, pre-test electronic components 8 carried on a feed tray 102 of the handler 10 are pushed against the contact section 201 of the test head 20 by X-Y conveyers 104 and 105, and the electronic components are tested through the test head 20 and the cable 40, and then the electronic components 8 finished being tested are placed onto sorting trays 103 in accordance with the results of the tests.

The handler 10 is provided with a board 109. On the board 109 are provided conveyers 104 and 105 of the electronic components to be tested. Also, the board 109 further is formed with an opening 110. As shown in FIG. 2, electronic components 8 are pressed against contact section 201 of the test head 20 arranged behind the handler 10 through this opening 110.

The board 109 of the handler 10 is provided with two X-Y conveyers 104 and 105.

Among these, the X-Y conveyer 104 is configured to be able to move an electronic component suction device 104d provided on a mount base 104c from a region of the storing trays 103 to feed trays 102, empty trays 101, the heat plate 106, and two buffer sections 108 by rails 104a and 104b provided along its X-direction and Y-direction. Further, a pad 1041 of the electronic component suction device 104d is designed to be able to be moved in the Z-direction (that is, the vertical direction) by a Z-axis actuator (not shown). The electronic component suction device 104d has an air cylinder (not shown) for elevating and lowering the pad 1041 for holding the electronic component 8 by suction via a rod, and two electronic components 8 can be picked up, conveyed, and released at one time by the two suction device 104d provided at the mount base 104c.

On the other hand, the X-Y conveyer 105 is configured to be able to move an electronic component suction device 105d provided on the mount base 105c between the two buffer sections 108 and the test head 20 by rails 105a and 105b provided along its X-direction and Y-direction. Further, a pad 1051 of the electronic component suction device 105d is configured to be able to be moved in the Z-direction (that is, the vertical direction) by a Z-axial actuator (not shown). The electronic component suction device 105d has an air cylinder (not shown) for elevating and lowering the pad 1051 for holding the electronic component 8 by suction via a rod 1052a, and two electronic components 8 can be picked up, conveyed, and released at one time by the two suction device 105d provided at the mount base 105c.

The two buffer sections 108 are configured to be able to move back and forth between the operating regions of the two X-Y conveyers 104 and 105 by the rails 108a and an actuator (not shown). The buffer section 108 at the top in FIG. 1 works to convey electronic components 8 conveyed from the heat plate 106 to the test head 20, while the buffer section 108 at the bottom in FIG. 1 works to eject the electronic components 8 finished being tested at the test head 20. The provision of these two buffer sections 108 enables the two X-Y conveyers 104 and 105 to operate simultaneously without interfering with each other.

In the operating region of the X-Y conveyer 104 are provided a feed tray 102 on which pre-test electronic components 8 are loaded, four sorting trays 103 on which tested electronic components 8 are classified into categories according to the test results, an empty tray 101, a heat plate 106.

The heat plate 106 is for example a metal plate and is formed with a plurality of indentations 106a into which electronic components 8 are dropped. Pre-test electronic components 8 from the feed tray 102 are transferred to the indentations 106a by the X-Y conveyer 104. The heat plate 106 is a heat source for applying a predetermined thermal stress to the electronic components 8. The electronic components 8 are heated to a predetermined temperature by the heat plate 106, then pushed against the contact section 201 of the test head 20 through the buffer sections 108 at the top in FIG. 1. A heat source, such as a heater, may be provided to the electronic component suction devices 104d and 105d of the X-Y conveyers 104 and 105 for conveying the electronic components 8 heated by the heat plate 106 so that the temperature of the heated electronic components 8 is not lowered in a conveying process.

The contact section 201 of the test head 20, as shown in FIG. 3, is provided with frog rings 202 electrically connected via the test head 20 and the cable 203. The frog ring 202 has a plurality of spring probe pins 204 (pins able to be expanded and contracted and capable of advancing and retracting an end portion thereof in the axial direction by a built-in spring) provided facing upward in a ring. A performance board 205 is provided on the spring probe pins 204 so that the end portions of the spring probe pins 204 are connected to terminals (not shown) of the performance board 205. An electronic component testing unit 5 to be loaded with an electronic component 8 is mounted to the top of the performance board 205 in an electrically connected state. Due to this, the electronic component testing unit 5 is electrically connected to the test head 20 through the performance board 205, spring probe pins 204, frog rings 202 and cables 203.

As shown in FIG. 4(a) to FIG. 4(c), the electronic component testing unit 5 comprises an electronic component testing socket base 6 and an electronic component testing socket 7 mounted on a socket board 64 of the electronic component testing socket base 6.

Figure 10:
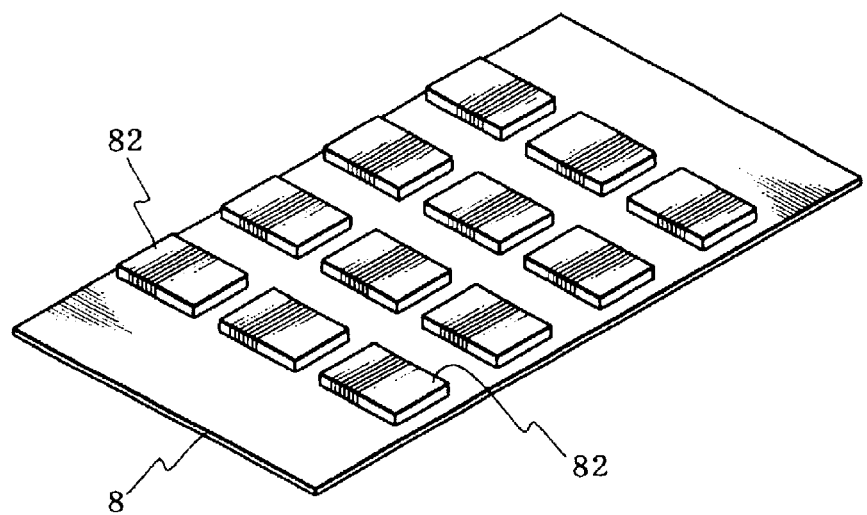
FIG. 10(a) is a perspective view of a strip format IC device as an example of an electronic component.
FIG. 10(b) is a view from below of the strip format IC device.
Figure 10:
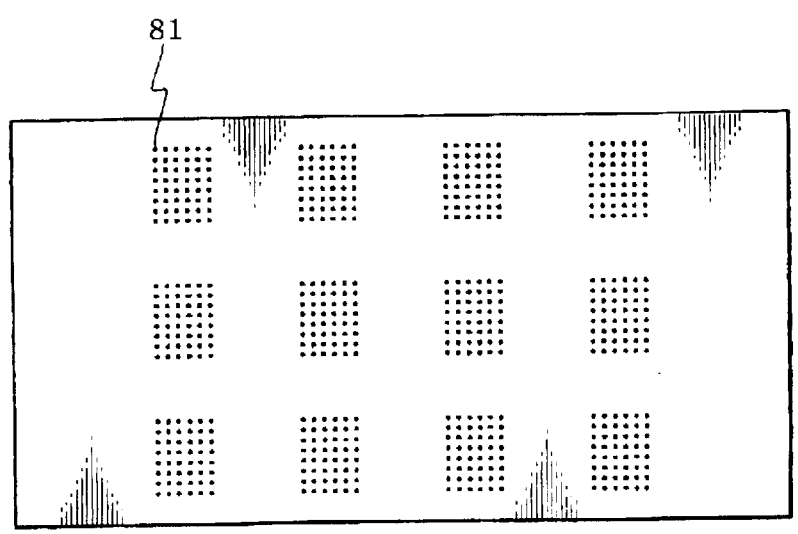

The electronic component testing socket 7 is provided with connection terminals 71 and a socket body 72 as shown in FIG. 5(a) to FIG. 5(c) and configured to be able to load and unload an electronic component 8. The electronic component 8 to be loaded on the electronic component testing socket 7 is a strip format IC device as shown in FIG. 10(a) and FIG. 10(b). The strip format IC device, as shown in FIG. 10 (a), is an IC device in a stage before IC chips are cut out therefrom and is an aggregate of a plurality of IC chips 82. On the lower surface thereof are arranged leaving a certain space external terminals 81 (solder ball) of the respective IC chips 82 arranged in a matrix.

The socket body 72 comprises a connection terminal holder 73 for holding the connection terminals 71 and a flat plate section 74 provided under the connection terminal holder 73.

The connection terminal holder 73 comprises a bottom plate section 731, an upper plate section 732 arranged in parallel with the bottom plate section 731, and a side plate section 733 arranged vertical to the bottom plate section 731 and the upper plate section 732, and forms an emptied rectangular solid shape. On a pair of mutually facing side plate sections 733 (at the top and the bottom in FIG. 5(a)) of the connection terminal holder 73 is provided with a flat plate section 74 whose lower surface is identical with the lower surface of the bottom plate section 731.

Inside the connection terminal holder 73 is formed a socket body inside space 75 surrounded by the bottom plate section 731, upper plate section 732 and bottom plate section 733, and two of each of a gas inlet 76 and gas outlet 77 connected to the socket body inside space 75 are provided on both sides (on the right and left in FIG. 5(a)) of the bottom plate section 731. Due to these, a gas outside the electronic component testing socket 7 can be flown from the gas inlet 76 into the socket body inside space 75 and a gas inside the socket body inside space 75 can be flown out from the gas outlet 77 to outside the electronic component testing socket 7.

The connection terminals 71 held on the connection terminal holder 73 are probe pins (preferably, spring probe pins). The connection terminals 71 are held so as to be vertical with respect to the bottom plate section 731 and the upper plate section 732 of the connection terminal holder 73, an upper end of the connection terminal 71 protrudes upward from the upper surface of the upper plate section 732 and an lower end thereof is protruding downward from the lower surface of the bottom plate section 731. The number and positions of the connection terminals 71 held on the connection terminal holder 73 correspond to those of the external terminals 81 of an electronic component 8 loaded on the electronic component testing socket 7. The upper ends of the connection terminals 71 protruding upward from the upper surface of the upper plate section 732 of the connection terminal holder 73 are made to be able to contact the external terminal 81 of an electronic component 8 when the electronic component 8 is loaded on the electronic component testing socket 7. Also, the lower ends of the connection terminals 71 protruding downward from the lower surface of the bottom plate section 731 of the connection terminal holder 73 are electrically connected to connection terminal connectors 642 of the socket board 64.

As shown in FIG. 6(a) to FIG. 6(c), the electronic component testing socket base 6 comprises a base body 61 and a socket board 64 provided on top of the base body 61.

The base body 61 comprises a frame shaped side plate section 612, a bottom plate section 611 arranged lying under a pair of side plate section 612 facing to each other, a division plate section 613 arranged upright on both sides of the bottom plate section 611 by over the pair of mutually facing side plate section 612 on which the bottom plate section 611 is arranged in a side way, and a partition section 614 arranged upright on the bottom plate section 611 over the pair of mutually facing division plate 613. Upper end portions of the side plate section 612, division plate section 613 and partition section 614 of the base body 61 are at the same height, and the socket board 64 arranged on top of the base body 61 is supported by the side plate section 612, division plate 613 and partition section 614.

The socket board 64 comprises a board body 641, connection terminal connectors 642 provided on the board body 641 and terminal sections 643.

The connection terminal connectors 642 are provided for the number and at positions corresponding to the connection terminals 71 held by the connection terminal holder 73 of the electronic component testing socket 7 and electrically connected to lower end portions of the connection terminals 71 protruding downwardly from the lower surface of the bottom plate section 731 of the connection terminal holder 73. Also, the connection terminal connectors 642 are electrically connected to the terminal sections 643 through wiring (not shown) of the board body 641, and the terminal sections 643 is electrically connected to terminal sections (not shown) of the Performance board 205 through a cable 90. As a result, a test signal sent through the test head 20 is transferred to the connection terminals 71 of the electronic component testing socket 7 via the performance board 205 and the socket board 64, while a respond signal send from the electronic component 8 through the connection terminals 71 are transferred to the test head 20 through the socket board 64 and the performance board 205.

Inside the base body 61 are formed two concave portions by the bottom plate section 611, side plate sections 612, division plate section 613 and partition section 614, and an opening of each of the concave portions is sealed by a socket board 64 provided on top of the base body 61. As a result, inside the electronic component testing socket base 6 is formed a first space 67 and a second space 68 surrounded by the bottom plate section 611, side plate sections 612, division plate section 613 and partition section 614, and the first space 67 and the second space 68 are divided by the partition section 614.

In the base body 61, one (on the left in FIG. 6(a)) of the pair of mutually facing side plate sections 612 to which the bottom plate section 611 is arranged in a side way is provided with a gas inlet 62 connected to the first space 67, and the other (on the right in FIG. 6(a)) is provided a gas outlet 63 connected to the second space 68. Also, the socket board 64 is provided with two of each of a gas outlet 65 connected to the first space 67 and a gas inlet 66 connected to the second space. Thus, a gas outside the electronic component testing socket base 6 can be flown from the gas inlet 62 of the base body 61 to the first space 67 and flown out from the gas outlet 65 of the socket board 64 to outside the electronic component testing socket base 6, while, a gas outside the electronic component testing socket base 6 can be flown from the gas inlet 66 on the socket board 64 to the second space 68 and flown from the gas outlet 63 on the base body 61 to outside the electronic component testing socket base 6.

The gas outlet 65 and the gas inlet 66 of the socket board 64 are provided at positions corresponding to the gas inlet 76 and gas outlet 77 provided on the bottom plate section 731 of the connection terminal holder 73. As a result, the first space 67 formed inside the electronic component testing socket base 6 and the socket body inside space 75 formed inside the electronic component testing socket 7 are connected via the gas outlet 65 of the socket board 64 and the gas inlet 76 of the electronic component testing socket 7, while the second space 68 formed inside the electronic component testing socket base 6 and the socket body inside space 75 formed inside the electronic component testing socket 7 are connected via the gas inlet 66 of the socket board 64 and the gas outlet 77 of the electronic component testing socket 7.

Accordingly, in the electronic component testing unit 5, a gas outside the electronic component testing unit 5 can be flown from the gas inlet 62 of the base body 61 to the first space 67 and flown to the socket body inside space 75 via the gas outlet 65 of the socket board 64 and the gas inlet 76 of the electronic component testing socket 7, and a gas in the socket body inside space 75 can be flown to the second space 68 via the gas outlet 77 of the electronic component testing socket 7 and the gas inlet 66 of the socket board 64 and flown from the gas outlet of the base body 61 to outside the electronic component testing unit 5.

As shown in FIG. 4(a) and FIG. 4(b), the gas inlet of the base body 61 is connected to a gas supply tube 91 of a thermoregulated gas supplier (not shown), and the gas outlet 63 of the base body 61 is connected to a gas discharge tube 92 of the thermoregulated gas supplier. The thermoregulated gas supplier is configured to be able to supply a thermoregulated gas through the gas supply tube 91 and to discharge a gas through the gas discharge tube 92 successively or intermittently.

The thermoregulated gas supplied from the thermoregulated gas supplier through the gas supply tube 91 is flown from the gas inlet 62 of the base body 61 to the first space 67, and then, flown into the socket body inside space 75 via the gas outlet 65 of the socket board 64 and the gas inlet 76 of the electronic component testing socket 7. The thermoregulated gas in the socket body inside space 75 is flown to the second space 68 via the gas outlet 77 of the electronic component testing socket 7 and the gas inlet 66 of the socket board 64, and then, discharged from the gas outlet 63 of the base body 61 through the gas discharge tube 92. Accordingly, supply of a thermoregulated gas to the socket body inside space 75 and discharge of a gas from the socket body inside space 75 can be operated successively or intermittently by the thermoregulated gas device.

When a heated gas is supplied to the socket body inside space 75, the electronic component testing socket 7 is heated by the heated gas in the socket body inside space 75 and the temperature of the electronic component testing socket rises. Also, when a cooled gas is supplied to the socket body inside space 75, the electronic component testing socket 7 is cooled by the cooled gas in the socket body inside space 75 and the temperature of the electronic component testing socket 7 falls. Therefore, by adjusting an amount and temperature of the thermoregulated gas to be supplied to the socket body inside space 75, the temperature of the electronic component testing socket 7 can be controlled.

The electronic component testing socket 7 of the electronic component testing unit 5 is provided with socket guides 207 having openings 207a and guide pins 207b as shown in FIG. 3, and electronic components 8 held by suction by the electronic component suction devices 105d are pressed against the electronic component testing sockets 7 through the openings 207a of the socket guide 207. At this time, the guide pins 207b provided to the socket guides are inserted to guide holes 1051a formed on the electronic component suction devices 105d, and thereby, alignment of the electronic components 8 and the electronic component testing sockets 7 is performed.

Below, an operation of the electronic component testing apparatus 1 will be explained by a case of testing an electronic component 8 under a high temperature condition as an example.

A pre-test electronic component 8 carried on the feed tray 102 of the handler 10 is picked up and held by the X-Y conveyer 104 and transferred to an indentation 106a of the heat plate 106. By leaving it there for exactly a predetermined time, the electronic component 8 rises to a predetermined temperature. The X-Y conveyer 104 transferring the not yet heated electronic component 8 from the feed tray 102 to the heat plate 106 releases the electronic component 8, then picks up and holds an electronic component which had been left at the heat plate 106 and had been raised to the predetermined temperature and transfers it to the buffer section 108.

The buffer section 108 to which the heated electronic component has been transferred moves to the right end of the rail 108a, and the electronic component 8 is picked up and held by the electronic component suction device 105d of the X-Y conveyer 105, pressed against the electronic component testing socket 7 of the test head 20 through the opening 110 on the board 109 and tested.

The electronic component testing socket 7 to which the heated electronic component 8 is pressed is successively or intermittently supplied a heated gas to the socket body inside space 75 formed therein through the gas supply tube 91 of the thermoregulated gas supplier, consequently, the temperature of the electronic component testing socket 7 is controlled.

Since a heated gas is successively or intermittently supplied to the socket body inside space 75 of the electronic component testing socket 7, the electronic component testing socket 7 is in the state of being hard to be affected by a temperature change due to a heat transfer via a contact portion with the outside (for example, an outside air).

When controlling the temperature of the electronic component testing socket 7, it is possible to suppress a reduction of a thermal stress given to an electronic component 8 due to a heat transfer from the electronic component 8 to the electronic component testing socket 7 at the time of mounting the electronic component 8 to the electronic component testing socket 7 by making the temperature of the electronic component testing socket 7 to be the same or approximately the same with that of the electronic component 8. Also, it is possible to prevent an application of a thermal stress exceeding a predetermined temperature on the electronic component 8 doe to a heat transfer from the electronic component testing socket 7 to the electronic component 8.

Also, when controlling the temperature of the electronic component testing socket 7, by making the temperature of the electronic component testing socket to be a temperature of causing the same or approximately the same heat expansion as that caused in the electronic component 8, contact credibility of the external terminal 81 of the electronic component 8 and the connection terminal 71 of the electronic component testing socket 7 can be assured.

In the case where the heat expansion rate of the electronic component 8 and that of the electronic component testing socket 7 are the same or approximately the same, when the temperature of the electronic component testing socket 7 is controlled to be the same or approximately the same temperature of the electronic component 8, contact credibility of the external terminal 81 of the electronic component 8 and the connection terminal 71 of the electronic component testing socket 7 can be assured, and at the same time, a reduction of a thermal stress given to the electronic component 8 can be suppressed. On the other hand, in the case where the heat expansion rate of the electronic component 8 and that of the electronic component testing socket 7 are different, the temperature of the electronic component testing socket 7 is controlled to be a different temperature from the temperature of the heated electronic component 8, so that the thermal stress given to the electronic component 8 may be reduced and a thermal stress exceeding a predetermined temperature may be applied to the electronic component 8. Thus, in the case that the thermal stress given to the electronic component 8 may be reduced, it is preferable that a heat source capable of heating the electronic component 8 loaded on the electronic component testing socket 7 to a predetermined temperature is separately provided, while in the case where a thermal stress exceeding a predetermined temperature may be applied to the electronic component 8, it is preferable that a cooling source capable of cooling the electronic component 8 loaded on the electronic component testing socket 7 to a predetermined temperature is separately provided.

A test signal is applied from the testing main device 30 to the electronic component 8 loaded on the electronic component testing socket 7 through the test head 20, and a respond signal read from the electronic component 8 is sent to the testing main device 30 through the test head 20, and thereby, performance and functions of the electronic component 8 are tested. The test on the electronic component 8 is conducted while controlling the temperature of the electronic component testing socket 7, however, since the temperature controlling of the electronic component testing socket 7 is operated by using a heated gas as a medium, a noise is not mixed into the test signal applied to the electronic component 8 and the respond signal read from the electronic component and accurate test can be conducted.

Note that even when exchanging of the electronic component testing socket 7 is necessary, the electronic component testing socket 7 can be easily attached or removed in a state where the electronic component testing socket base 6 is fixed.

In the electronic component testing apparatus 1 according to the first embodiment, for example, modifications below can be made.

Figure 7:
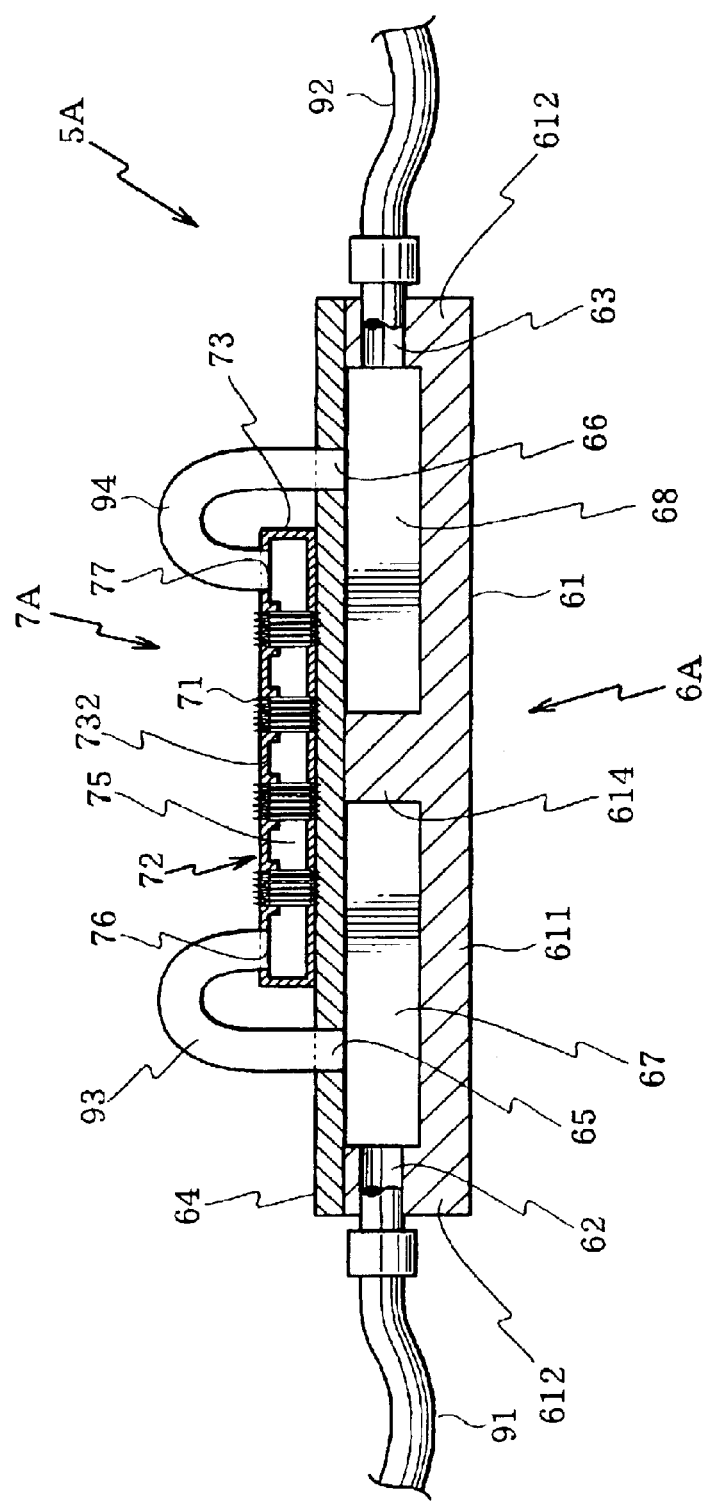
FIG. 7 is a cross sectional view of an electronic component testing unit according to another embodiment of the present invention.

In the electronic component testing apparatus 1, the electronic component testing unit 5 can be changed to an electronic component testing unit 5A as shown in FIG. 7. Note that FIG. 7 is a cross sectional view (a cross sectional view along the line B—B corresponding to FIG. 4(b)) of an electronic component testing unit 5A wherein same reference numbers are added to parts and portions corresponding to those in the electronic component testing unit 5 and explanations thereof will be omitted except for a necessary case.

As shown in FIG. 7, the electronic component testing unit 5A comprises an electronic component testing socket base 6A and an electronic component testing socket 7A mounted on a socket board 64 of the electronic component testing socket base 6A.

In the electronic component testing socket 7A, a gas inlet 76 and gas outlet 77 connected to a socket body inside space 75 are provided on the both sides of an upper plate section 732 of a connection terminal holder 73. Also, on the board body 641 of the socket board 64 on the electronic component testing socket base 6A, a gas outlet 65 and a gas inlet 66 are provided on a portion of not contacting the lower surface of the electronic component testing socket 7A at the time of mounting the electronic component testing socket 7A. The gas outlet 65 of the socket board 64 and the gas inlet 76 of the electronic component testing socket 7A are connected by a ventilation tube 93, and the first space 67 and the socket body inside space 75 are connected through the ventilation tube 93. Also, the gas inlet 66 of the socket board 64 and the gas outlet 77 of the electronic component testing socket 7A are connected through a ventilation tube 94, and the second space 68 and the socket body inside space 75 are connected through the ventilation tube 94.

A thermoregulated gas supplied from a thermoregulated gas supplier through a gas supply tube 91 is flown from a gas inlet 62 of the base body 61 to the first space 67, and then, flown to the socket body inside space 75 via the gas outlet 65 of the socket board 64, the ventilation tube 93 and the gas inlet 76 of the electronic component testing socket 7A. The thermoregulated gas in the socket body inside space 75 is flown to the second space 68 via the gas outlet 77 of the electronic component testing socket 7A, the ventilation tube 94 and the gas inlet 66 of the socket board 64, and then, discharged from the gas outlet 63 of the base body 61 through the gas discharge tube 92. As a result, the temperature of the electronic component testing socket 7A can be controlled.

Figure 8:
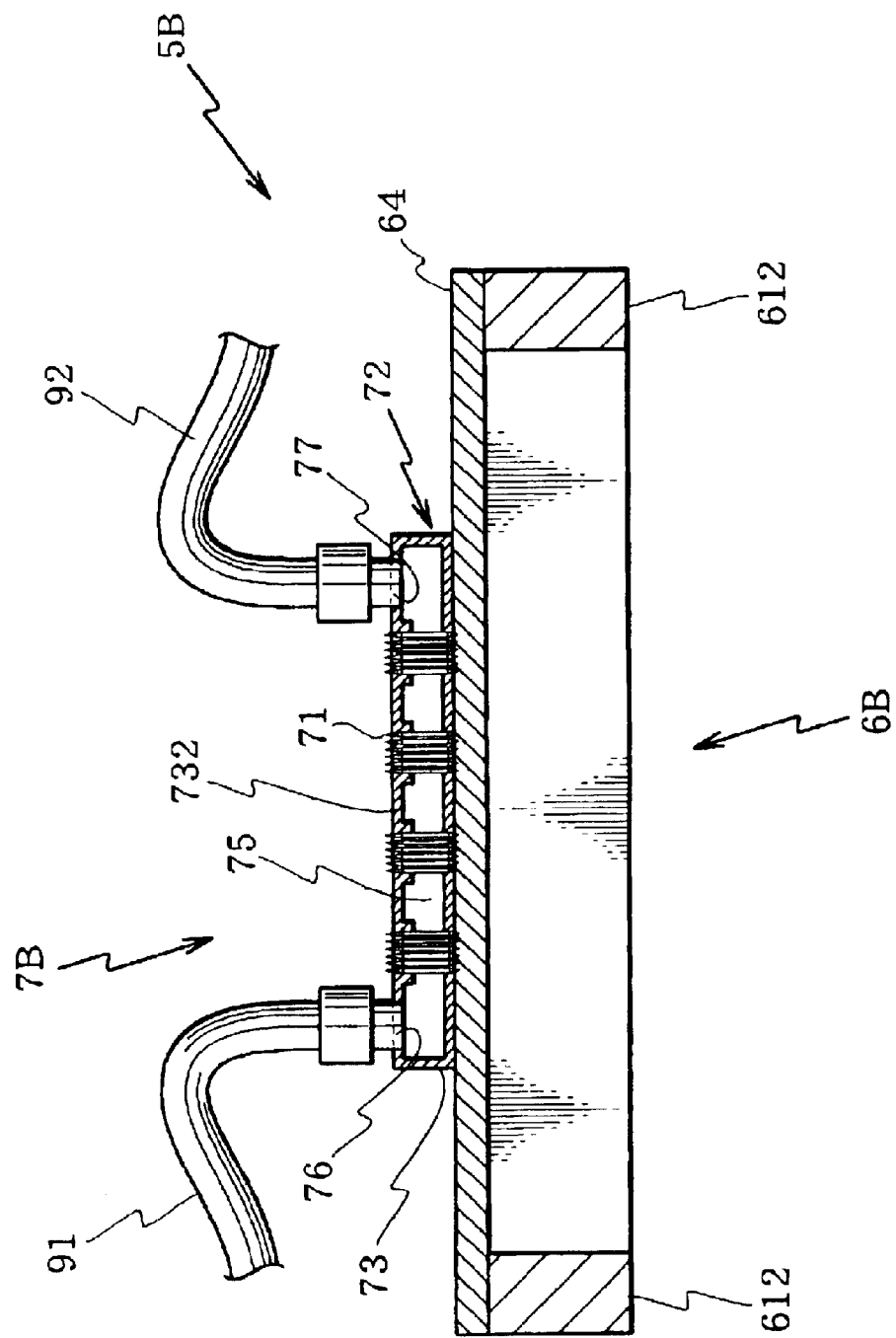
FIG. 8 is a cross sectional view of an electronic component testing unit according to another embodiment of the present invention.

In the electronic component testing apparatus 1, the electronic component testing unit 5 may be changed to an electronic component testing unit 5B shown in FIG. 8. Note that FIG. 8 is a cross sectional view (a cross sectional view along the line B—B corresponding to FIG. 4(b)) of an electronic component testing unit 5B wherein same reference numbers are added to parts and portions corresponding to those in the electronic component testing unit 5 and explanations thereof will be omitted except for a necessary case.

As shown in FIG. 8, the electronic component testing unit 5B comprises an electronic component testing socket base 6B and an electronic component testing socket 7B mounted on a socket board 64 of the electronic component testing socket base 6B.

In the electronic component testing socket 7B, a gas inlet 76 and gas outlet 77 connected to a socket body inside space 75 are provided on the both sides of an upper plate section 732 of a connection terminal holder 73. The gas inlet 76 is connected to the gas supply tube 91 of the thermoregulated supplier and the gas outlet 77 is connected to the gas discharge tube 92 of the thermoregulated supplier. As a result, a thermoregulated gas supplied from the thermoregulated gas supplier through the gas supply tube 91 is flown from the gas inlet 76 of the electronic component testing socket 7B to the socket body inside space 75, and the thermoregulated gas in the socket body inside space 75 is discharged from the gas outlet 77 of the electronic component testing socket 7B through the gas discharge tube 92. As a result, the temperature of the electronic component testing socket 7B can be controlled.

Note that, as shown in FIG. 8, the electronic component testing socket base 6B does not need to be provide with any of the gas inlet 65 and gas inlet 66 of the socket board 64, the first space 67, the second space 68, the gas inlet 62 and gas outlet 63 of the base body 61.

Figure 11:
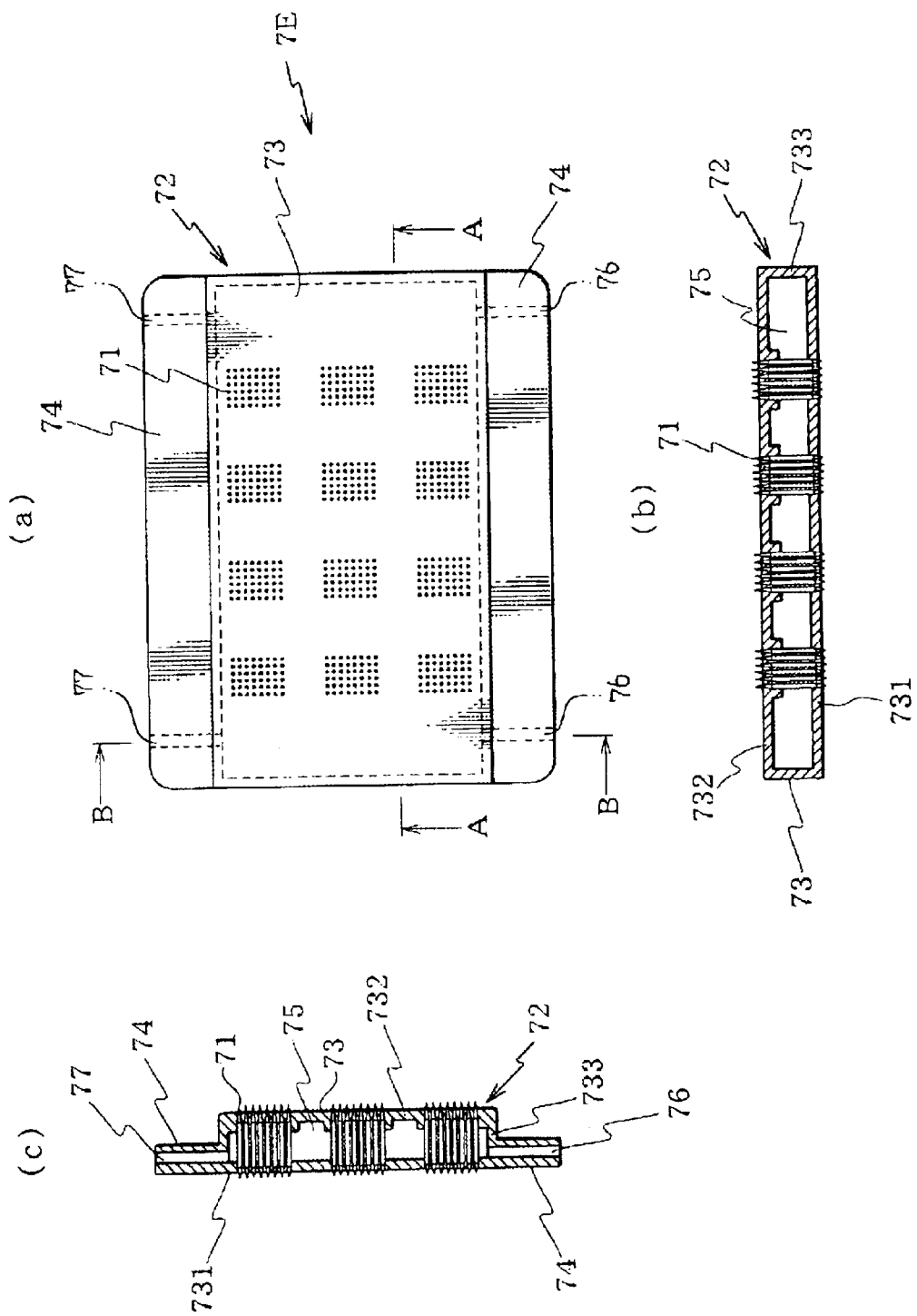
FIG. 11(a) is a view from the above of an electronic component testing socket according to another embodiment of the present invention.
FIG. 11(b) is a cross sectional view along the line A—A in FIG. 11(a)
FIG. 11(c) is a cross sectional view along the line B—B in FIG. 11(a)

In the electronic component testing unit 5B, an electronic component testing socket 7E shown in FIG. 11 can be used instead of the electronic component testing socket 7B.

The electronic component testing socket 7E, as shown in FIG. 11, is provided on a flat plate section 74 with a gas inlet 76 and gas outlet 77 connected to the socket body inside space 75, and the temperature of the electronic component testing socket 7E can be controlled in the same way as in the above by connecting the gas inlet 76 to the gas supply tube 91 of the thermoregulated gas supplier and connecting the gas outlet 77 to the gas discharge tube 92 of the thermoregulated gas supplier.

The gas inlet 76 and gas outlet 77 of the electronic component testing socket 7E, and the gas supply tube 91 and gas discharge 92 of the thermoregulated gas supplier may be connected directly or via other member. For example, when the electronic component testing socket 7E is provided with a socket guide, they can be connected by providing the socket guide with a gas flow path connecting the gas inlet 76 and gas outlet 77 of the electronic component testing socket 7E to the gas supply tube 91 and gas discharge tube 92 of the thermoregulated gas supplier.

Also, in the electronic component testing unit 5B, the gas supply tube 91 of the thermoregulated supplier can be connected by using the gas outlet 77 of the electronic component testing socket 7B and 7E as the gas inlet 76. In this case, a space between the upper plate section 732 of the connection terminal holder 73 and the connection terminal 71 serves as the gas outlet 77 in the electronic component testing socket 7B and 7E.

Figure 9:
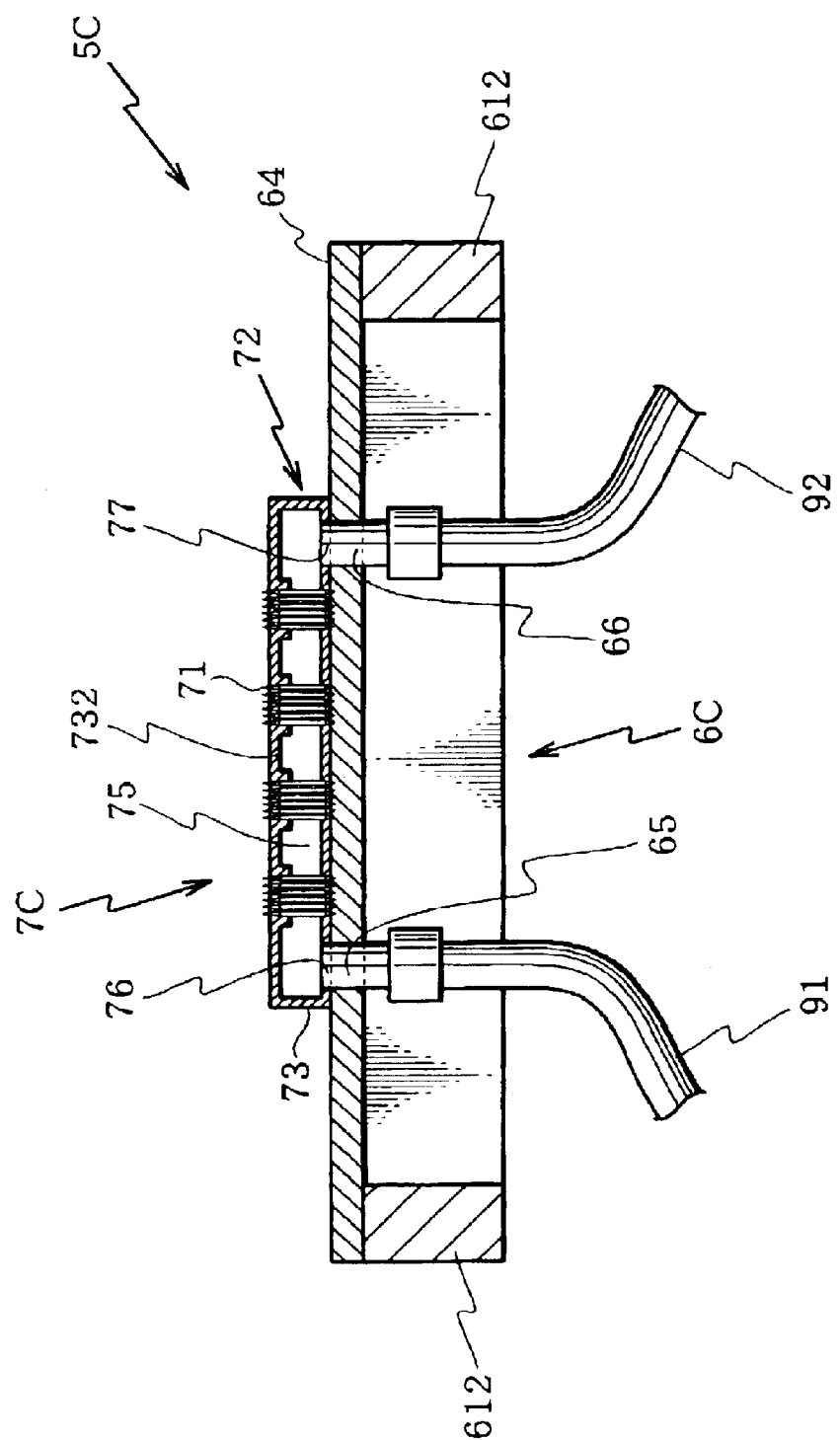
FIG. 9 is a cross sectional view of an electronic component testing unit according to another embodiment of the present invention.

In the electronic component testing apparatus 1, the electronic component testing unit 5 may be changed to an electronic component testing unit 5C shown in FIG. 9. Note that FIG. 9 is a cross sectional view (a cross sectional view along the line B—B corresponding to FIG. 4B) of an electronic component testing unit 5C wherein same reference numbers are added to parts and portions corresponding to those in the electronic component testing unit 5 and explanations thereof will be omitted except for a necessary case.

As shown in FIG. 9, the electronic component testing unit 5C comprises an electronic component testing socket base 6C and an electronic component testing socket 7C mounted on a socket board 64 of the electronic component testing socket base 6C.

In the electronic component testing socket base 6C, a gas supply tube 91 of a thermoregulated gas supplier is connected to a gas outlet 65 of a socket board 64, and a gas discharge tube 92 of the thermoregulated gas supplier is connected to the gas inlet 66 of the socket board. Accordingly, a thermoregulated gas supplied from the thermoregulated gas supplier through the gas supply tube 91 is flown to the socket body inside space 75 via the gas outlet 65 of the socket board 64 and the gas inlet 76 of the electronic component testing socket 7, and the thermoregulated gas in the socket body inside space 75 is discharged from the gas discharge tube 92 via the gas outlet 77 of the electronic component testing socket 7 and the gas inlet 66 of the socket board 64. As a result, the temperature of the electronic component testing socket 7C can be controlled.

Note that, as shown in FIG. 9, the electronic component testing socket base 6B does not need to be provided with any of the first space 67, second space 68, gas inlet 62 and gas outlet 63 of the base body 61.

Figure 12:
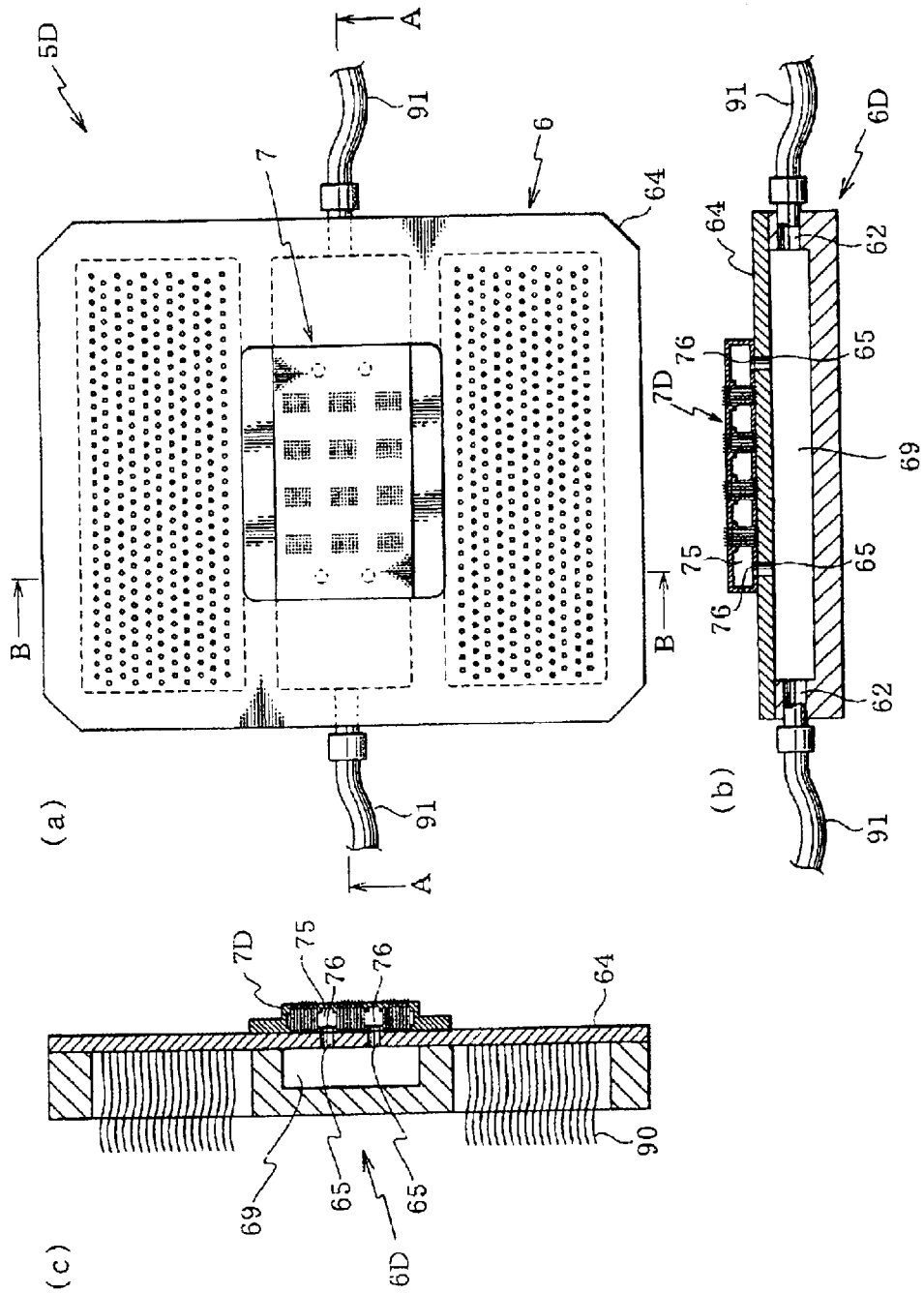
FIG. 12(a) is a view from the above of an electronic component testing unit according to another embodiment of the present invention.
FIG. 12(b) is a cross sectional view along the line A—A in FIG. 12(a)
FIG. 12(c) is a cross sectional view along the line B—B in FIG. 12(a)

In the electronic component testing apparatus 1, the electronic component testing unit 5 may be changed to an electronic component testing unit 5D shown in FIG. 12. Note that FIG. 12(a) is a view form above of the electronic component testing unit 5D, FIG. 12(b) is a sectional view along the line A—A in FIG. 12(a), FIG. 12(c) is a sectional view along the line B—B of FIG. 12(a), parts and portions corresponding to those in the electronic component testing unit 5 are given identical reference numbers, and explanations thereof are omitted except for a necessary case.

As shown in FIG. 12, the electronic component testing unit 5D comprises an electronic component testing socket base 6D and an electronic component testing socket 7D mounted on a socket board 64 of the electronic component testing socket base 6D.

The electronic component testing socket 7D is provided with two gas inlet 76 connected to the socket body inside space 75, respectively, on both sides of a bottom plate section 731 of a connection terminal holder 73 (on the right and left in FIG. 12(a)). Also, in the electronic component testing socket 7D, a space between the upper plate section 732 of the connection terminal holder 73 and the connection terminal 71 serves as a gas outlet 78.

The socket board 64 of the electronic component testing socket base 6D is provided with four gas outlets 65 at positions corresponding to the gas inlets 76 provided on the bottom plate section 731 on the connection terminal holder 73 of the electronic component testing socket 7D.

The base body 61 of the electronic component testing socket base 6D is not provided with a division plate section 613, inside the electronic component testing socket base 6D is formed one space 69 surrounded by the bottom plate section 611, side plate sections 612, division plate section 613 and socket board 64, and the gas outlet 65 of the socket board 64 is connected to the space 69.

A pair of mutually facing side plate sections 612 of the base body 61 of the electronic component testing socket base 6D are respectively provided with a gas inlet 62 connected to the space 69, and the gas inlet 62 of the base body 61 is attached a gas supply tube 91 of the thermoregulated gas supplier. Note that the socket board 64 of the electronic component testing socket base 6D is not formed a gas inlet, and the base body 61 is not formed a gas outlet connected to the space 69.

In the electronic component testing unit 5D, a thermoregulated gas supplied from the gas supplier through the gas supply tube 91 is flown from the gas inlet 62 of the base body 61 to the space 69, and then, flown to the socket body inside space 75 via the gas outlet 65 of the socket board 64 and the gas inlet 76 of the electronic component testing socket 7D, and the thermoregulated gas of the socket body inside space 75 can be flown from a space (a gas outlet) between the upper plate section 732 of the connection terminal holder 73 and the connection terminal 71. As a result, the temperature of the electronic component testing socket 7D can be controlled.

The electronic component testing units 5, 5A, 5B, 5C and 5D explained above can be also used in an electronic component testing apparatus of a chamber type. In this case, a thermoregulated gas in the chamber can be used as a thermoregulated gas to be flown into the socket body inside space 75 of the electronic component testing socket provided to each of the electronic component testing units. The thermoregulated gas in the chamber can be flown into the socket body inside space 75 by the gas supplier provided in the chamber. The mechanism of the gas supplier is not particularly limited as far as it can supply a thermoregulated gas in the chamber to the socket body inside space.

When the electronic component testing units 5, 5A, 5B, 5C and 5D are provided in the chamber, a thermoregulated gas in the chamber can be flown from a space (a gas inlet) between the upper plate section 732 of the connection terminal holder 73 and the connection terminal 71 to the socket body inside space 75 by aspirating a gas in the socket body inside space 75 of the electronic component testing socket provided to each of the electronic component testing units. As a result, the temperature of the electronic component testing socket can be also controlled. Aspiration of the gas in the socket body inside space 75 becomes possible by replacing the gas supplier mounted to each electronic component testing unit by a gas aspiration device.

In the electronic component testing socket 7, the configuration of the connection terminal holder 73 is not limited to an emptied rectangular solid shape, and can be modified as far as a space is formed therein and the connection terminal 71 can be held. For example, it may be an emptied cylinder shape, emptied circular cone shape with the head portion cut off, en emptied pyramid shape with the head portion cut off, etc. Note that it is preferable that the connection terminal holder 73 at least has two facing planes in parallel and has the configuration capable of holding a connection terminal 71 vertical with respect to the two planes.

In the electronic component testing socket 7, a capacity of the socket body inside space 75 formed inside the connection terminal holder 73 is not particularly limited, but it is preferable to secure the capacity of the socket body inside space 75 as large as possible in a range that the connection terminal holder 73 has strength capable of holding the connection terminal 71. It is because if an amount of a gas able to be flown into the socket body inside space 75 increases, it is possible to rapidly heat or cool the electronic component testing socket 7.

In the electronic component testing socket 7, from the viewpoint of reinforcing the connection terminal holder 73, by providing a reinforcing plate (not shown) inside the connection terminal holder 73, the socket body inside space 75 as one continued space can be divided by the reinforcing plate. In this case, a plurality of socket body inside spaces 75 are formed inside the connection terminal holder 73. The reinforcing plate can be provided with a gas inlet and/or gas outlet so that the socket body inside spaces 75 can be connected to each other. It is also possible not to provide a gas inlet nor gas outlet to the reinforcing plate so as not to connect the socket body inside spaces 75 to each other. When the socket body inside spaces 75 are connected, a gas inlet 76 and a gas outlet 77 connected to any one of the socket body inside spaces 75 are provided to the connection terminal holder 73. While, when the socket body inside spaces 75 are not connected to each other, a gas inlet 76 and gas outlet 77 connected to the same socket body inside space 75 are provided to the connection terminal holder 73.

In the electronic component testing socket 7, positions to provide the gas inlet 76 and gas outlet 77 are not particularly limited, and can be changed as far as they can connect to the socket body inside space 75. Also, the gas inlet 76 and the gas outlet 77 can be provided to different parts from each other among the bottom plate section 731, upper plate section 732 and side plate sections 733.

In the electronic component testing socket 7, the number of the gas inlet 76 and the gas outlet 77 are not particularly limited and may be any numbers from one or more. When providing a plurality of gas inlets 76 and gas outlets 77, positions to provide the respective gas inlets 76 and gas outlets 77 may be on the same part and different parts among the bottom plate section 731, upper plate section 732 and side plate sections 733.

The electronic component 8 to be tested by the electronic component testing apparatus 1 is not limited to a strip format IC device and an external terminal thereof is not also limited to a solder ball. The electronic component 8 may be an IC device, such as an IC chip and memory. Also, the external terminal 81 of the electronic component 8 may be for example a lead. In this case, the number, shape, configuration, size, etc. of the connection terminal 71 held by the connection terminal holder 73 can be suitably determined in accordance with a kind of the external terminal of the electronic component to be tested.

In the electronic component testing socket base 6, the configuration of the base body 61 can be changed as far as a socket board 64 can be supported on top thereof, and that when the socket board 64 is provided thereon, the first space 67 and the second space 68 can be formed inside the electronic component testing socket base 6.

In the electronic component testing socket base 6, by providing a reinforcing plate (not shown) in the first space 67 or the second space 68, the first space 67 or the second space 68 can be divided to a plurality of spaces. It is possible to provide a gas inlet and/or a gas outlet on the reinforcing plate so that the divided spaces can be connected to each other. Also, it is also possible not to provide any gas inlet nor gas outlet on the reinforcing plate so as not to connect the divided spaces to each other. When the spaces divided in the first space 67 are connected to each other, a gas inlet 62 connected to either one of the spaces is provided to the base body 61, and a gas outlet 65 connected to either one of the spaces is connected to the socket board 64. When the divided spaces in the second spaces are connected to each other, a gas outlet 63 connected to either one of the spaces is provided to the base body 61, and a gas inlet 66 connected to either one of the spaces is provided to the socket board 64. On the other hand, when the divided spaces in the first space 67 are not connected to each other, a gas inlet 62 and a gas outlet 65 connected to the same space are respectively provided to the base body 61 and the socket board 64. When the divided spaces in the second space 68 are not connected to each other a gas outlet 63 and a gas inlet 66 connected to the same space are respectively provided to the base body 61 and the socket board 64.

In the electronic component testing socket base 6, positions to provide a gas inlet 62 and gas outlet 63 provided to the base body 61 can be changed as far as they can connect to the first space 67 and the second space 68, respectively. For example, the gas inlet 62 and the gas outlet 63 can be provided to the bottom plate section 611 and division plate section 613 of the base body 2.

In the electronic component testing socket base 6, the numbers of gas inlets 62 and gas outlets 63 provided to the base body 61 are not particularly limited and may be any numbers from one or more. When providing a plurality of gas inlets 62 and gas outlets 63, positions to provide the respective gas inlets 62 and gas outlets 63 may be the same part and different parts among the bottom plate section 611, side plate section 612 and division plate section 613.

Second Embodiment

An embodiment of a chamber type will be explained as a second embodiment of the present invention based on the drawings.

Figure 13:
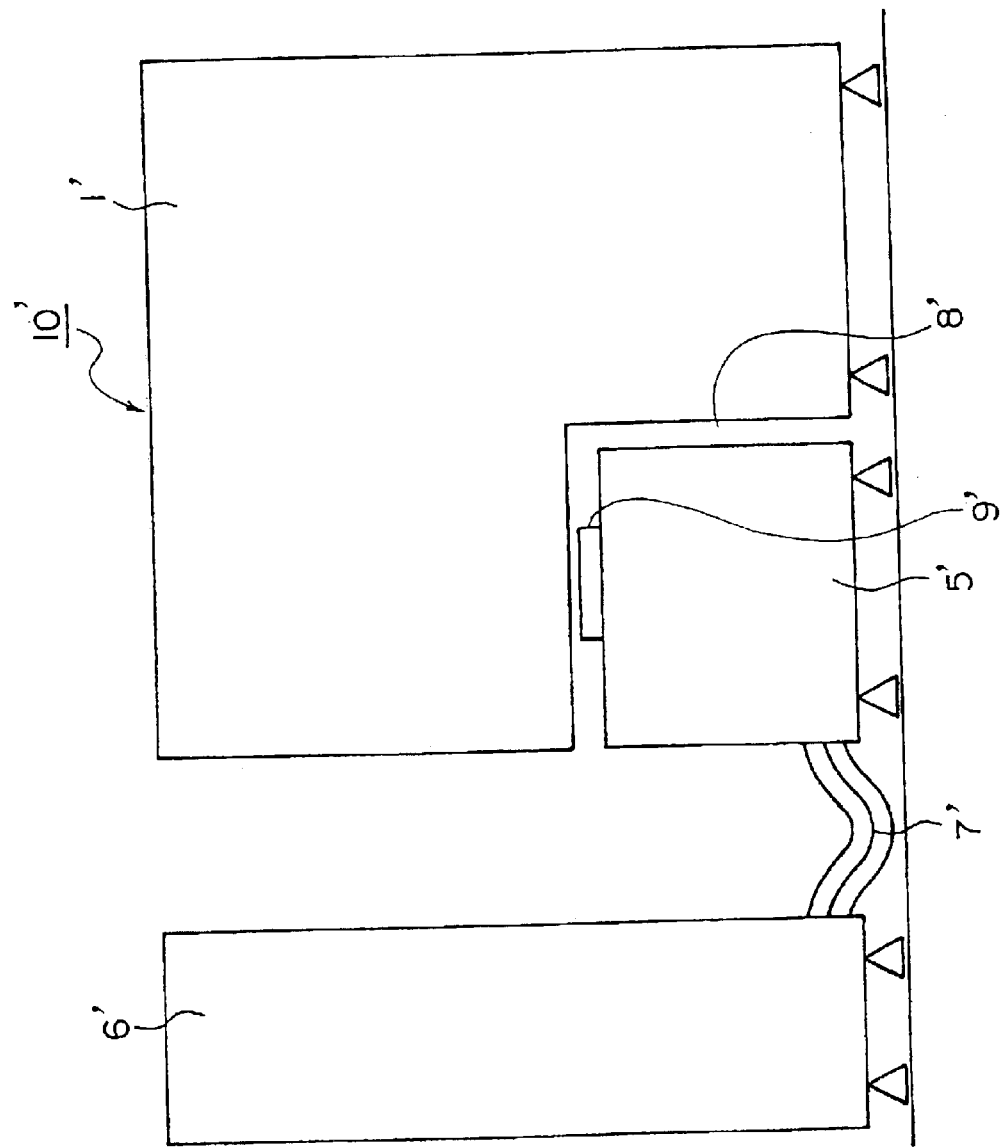
FIG. 13 is an overall view from the side of an IC testing apparatus according to an embodiment of an electronic component testing apparatus of the present invention.
Figure 14:
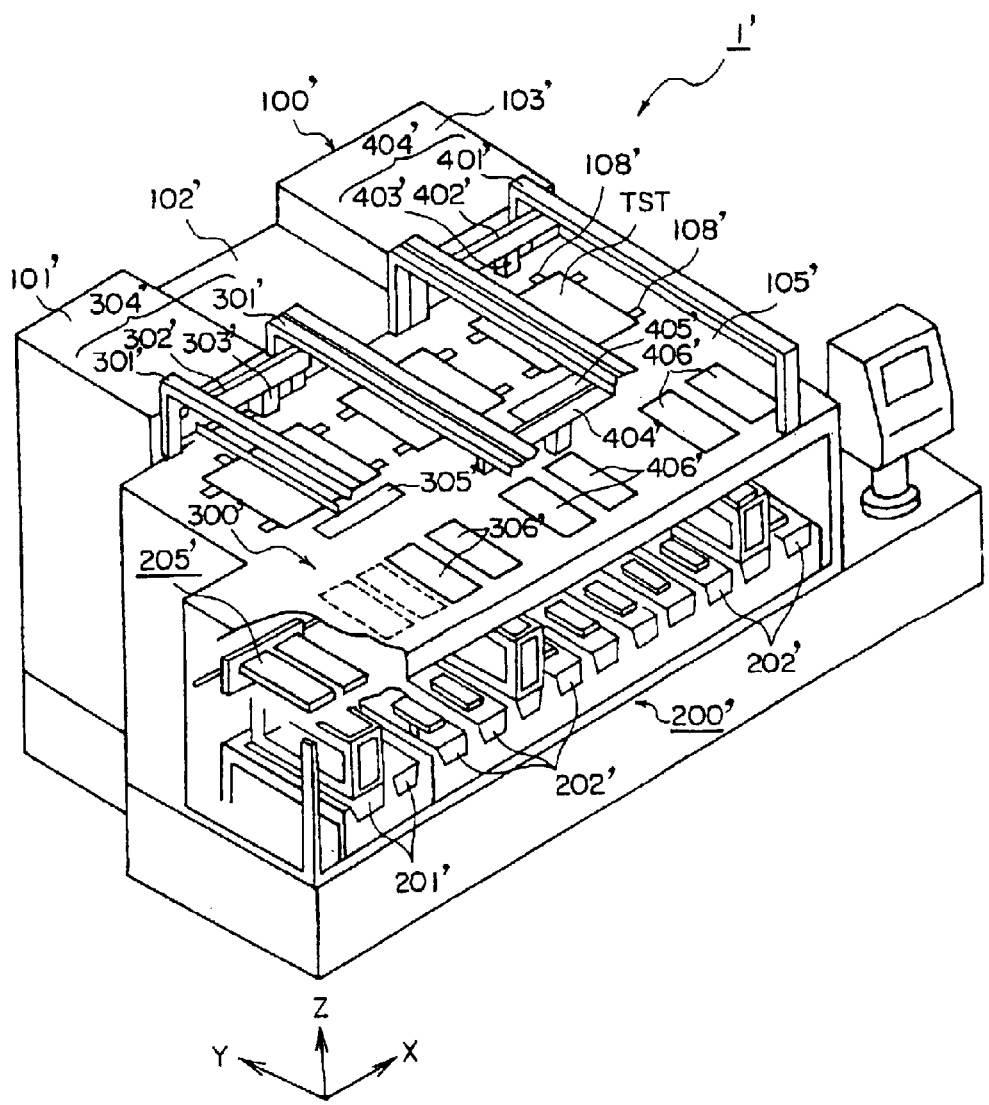
FIG. 14 is a perspective view of a handler in the IC testing apparatus.
Figure 15:
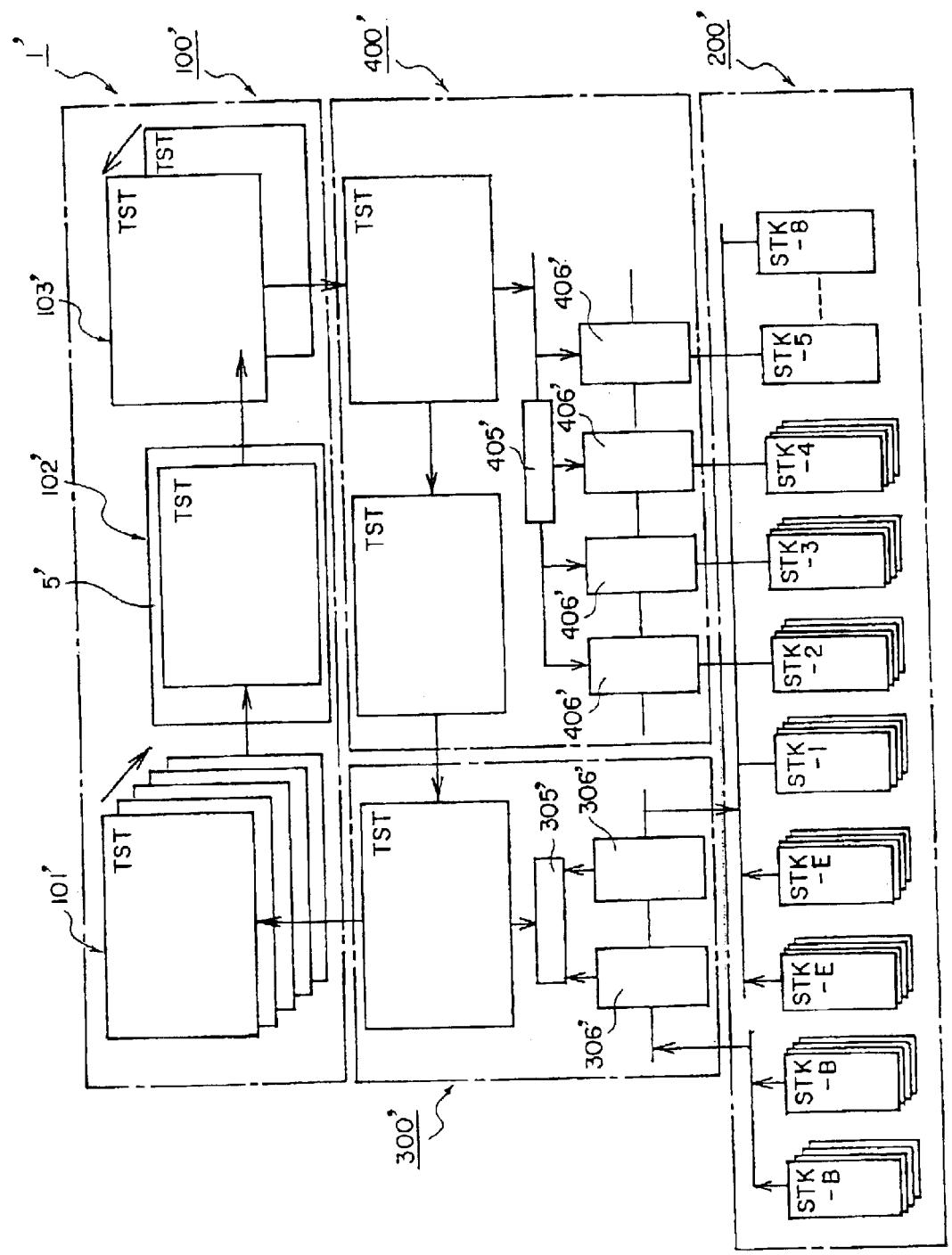
FIG. 15 is a flow chart of movement of a tray showing a method of handling an IC to be tested.
Figure 16:
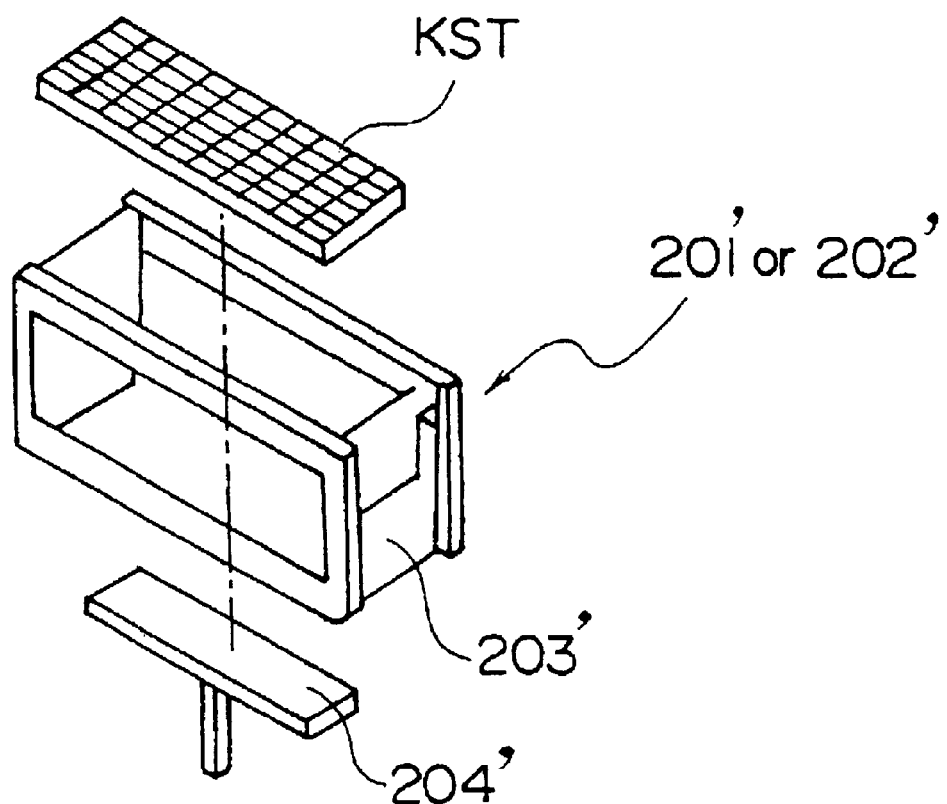
FIG. 16 is a perspective view of the structure of an IC stocker in the IC testing apparatus.
Figure 17:
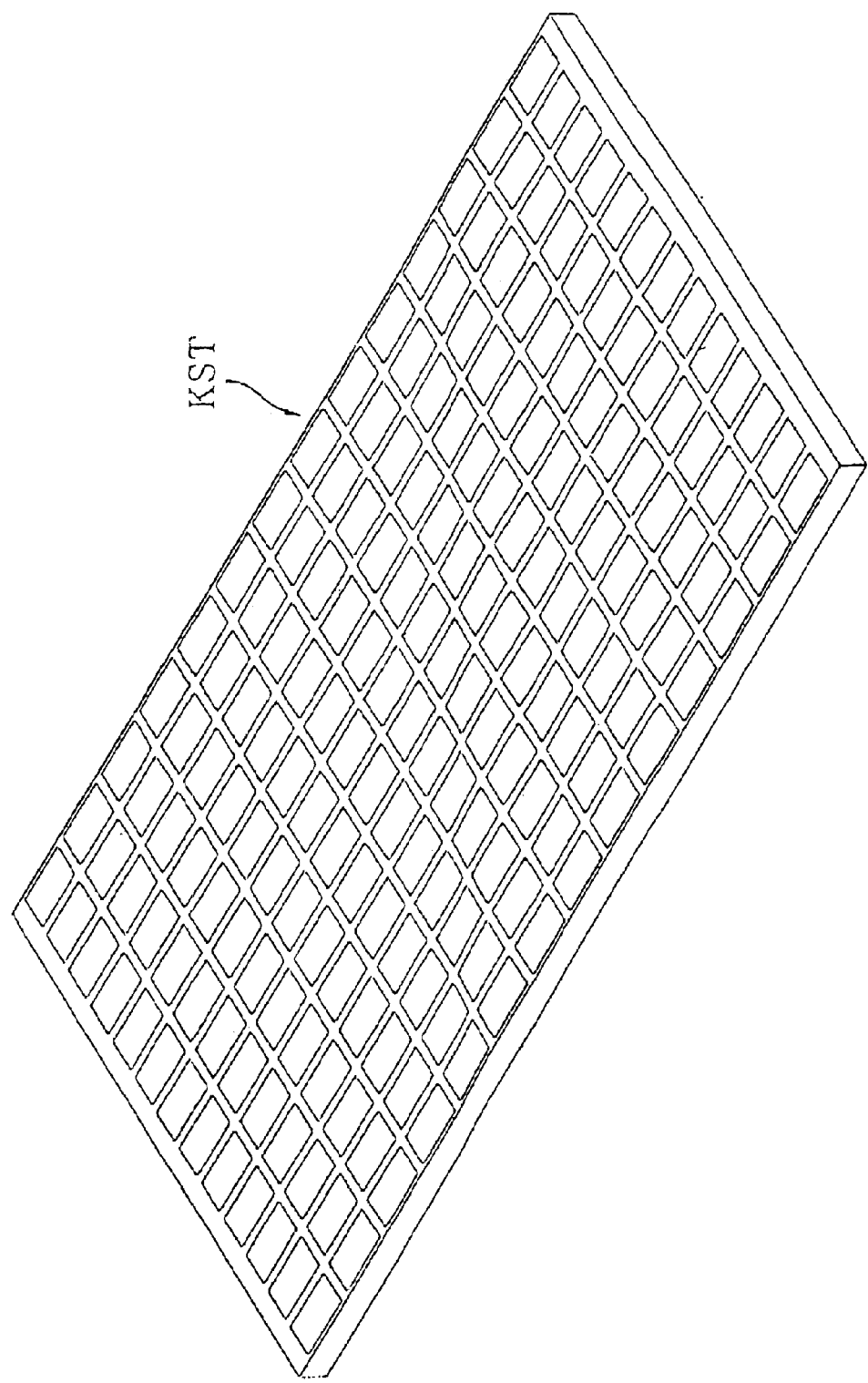
FIG. 17 is a perspective view of a customer tray used in the IC testing apparatus.
Figure 18:
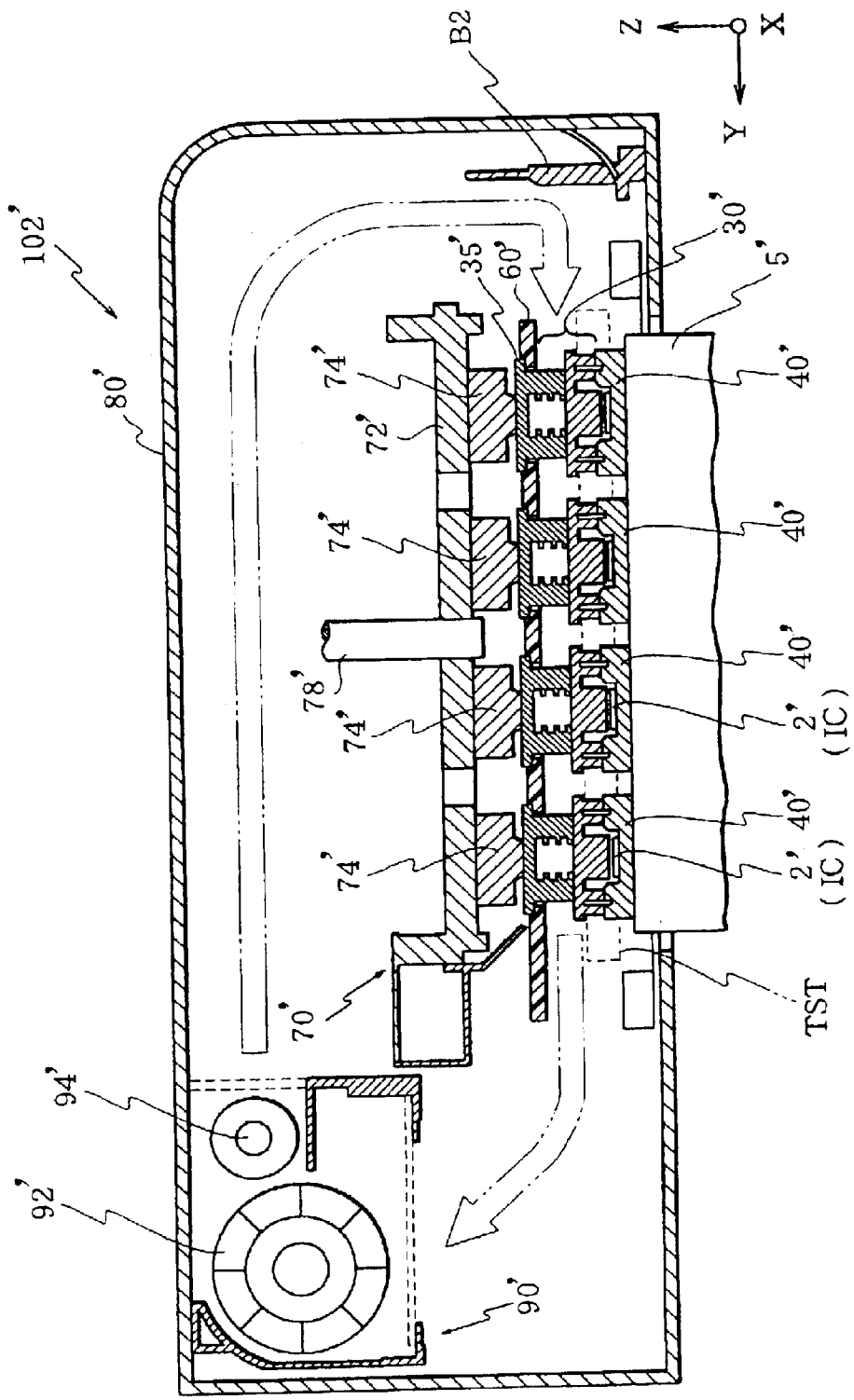
FIG. 18 is a cross sectional view of important parts in a test chamber in the IC testing apparatus.
Figure 19:
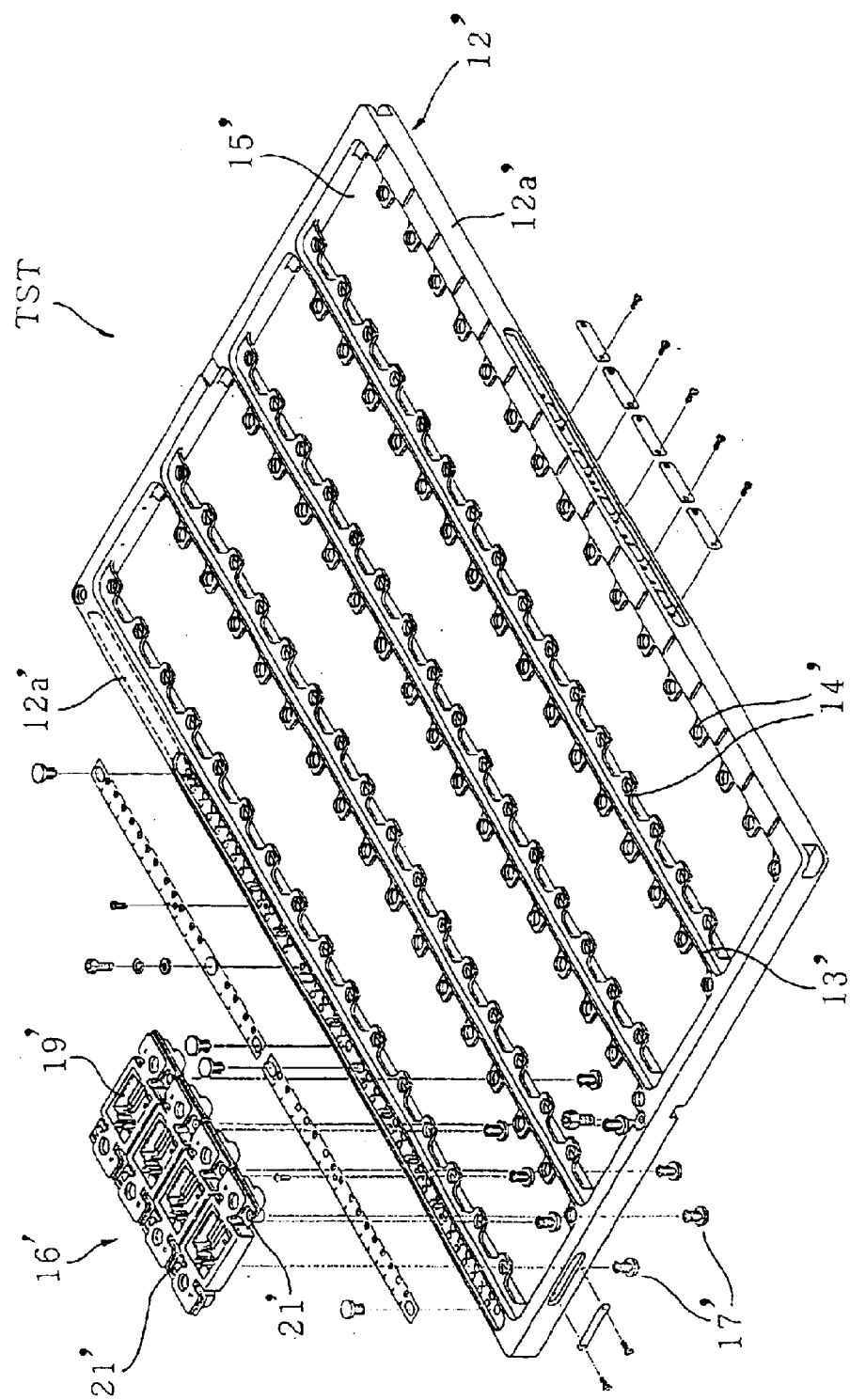
FIG. 19 is a partially disassembled perspective view of a test tray used in the IC testing apparatus.
Figure 20:
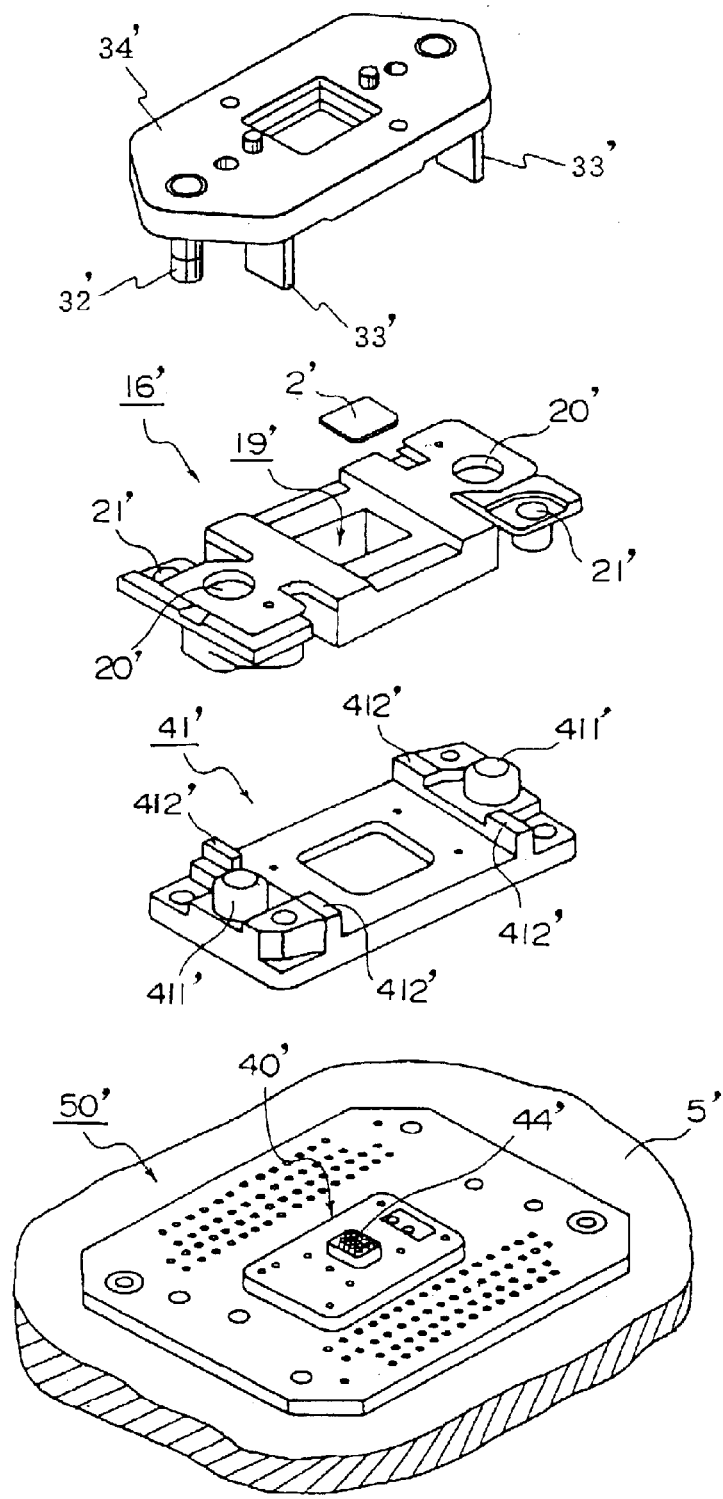
FIG. 20 is a disassembled perspective view of the configuration around a socket in a test head of the IC testing apparatus.
Figure 21:
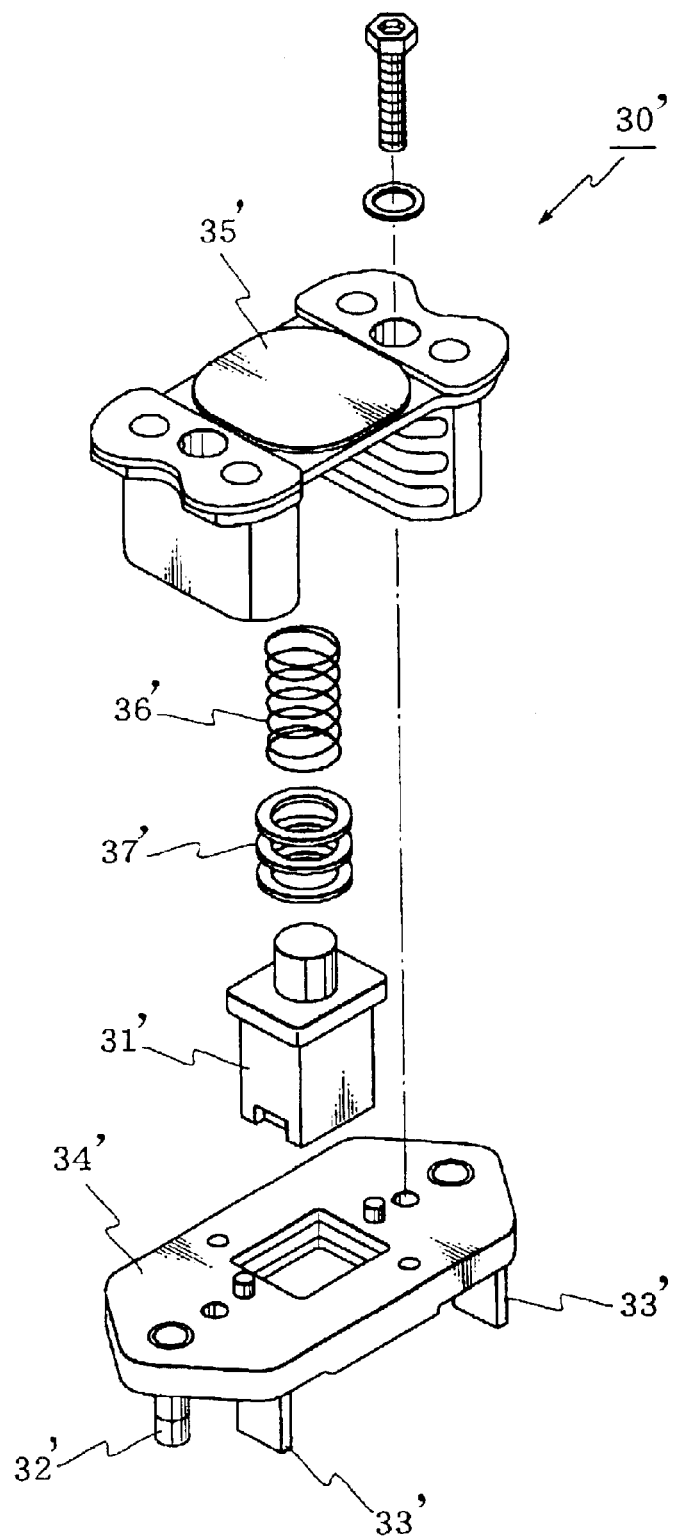
FIG. 21 is a disassembled perspective view of a pusher in the IC testing apparatus.
Figure 22:
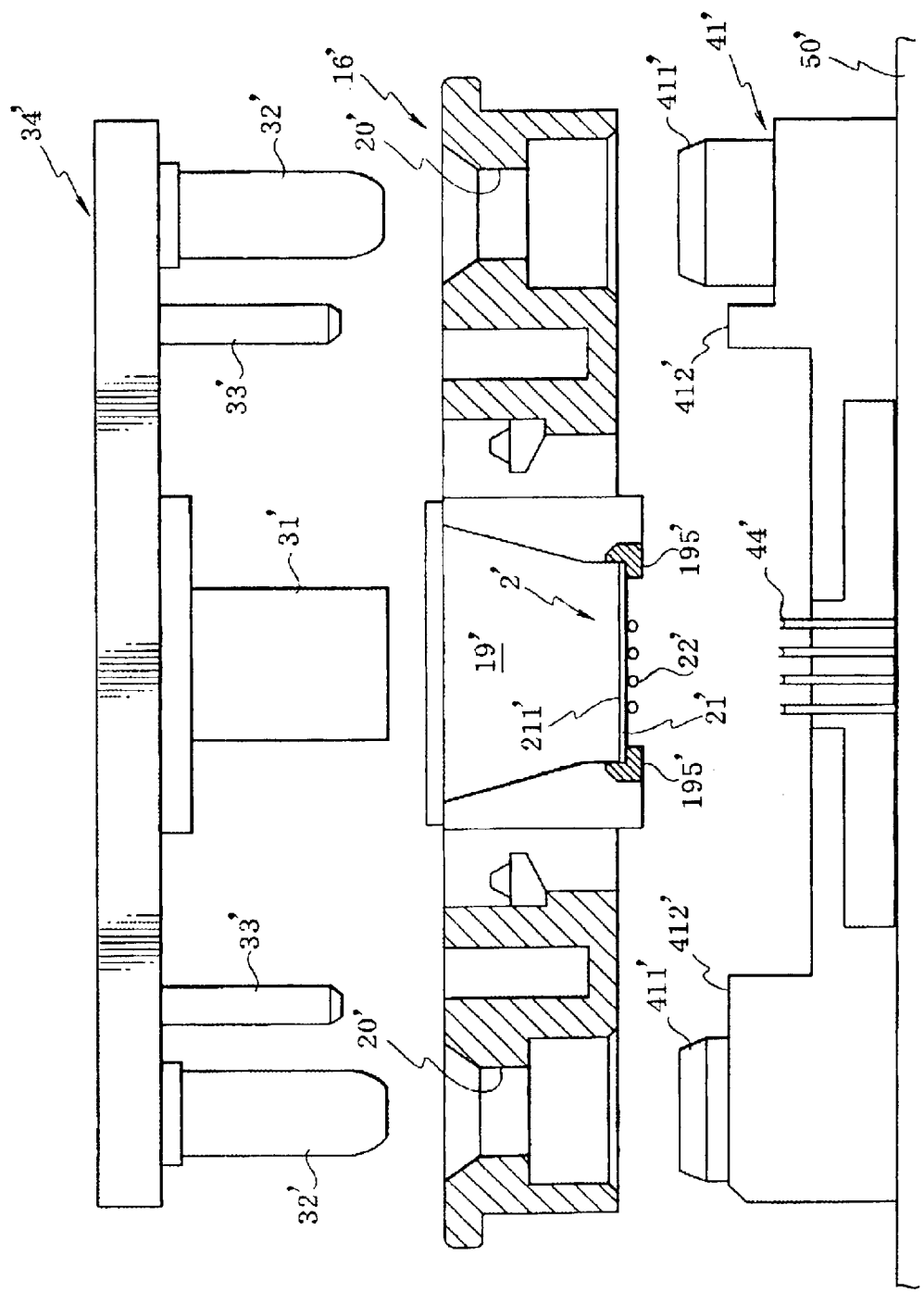
FIG. 22 is a partial cross sectional view around the socket in the IC testing apparatus.
Figure 23:
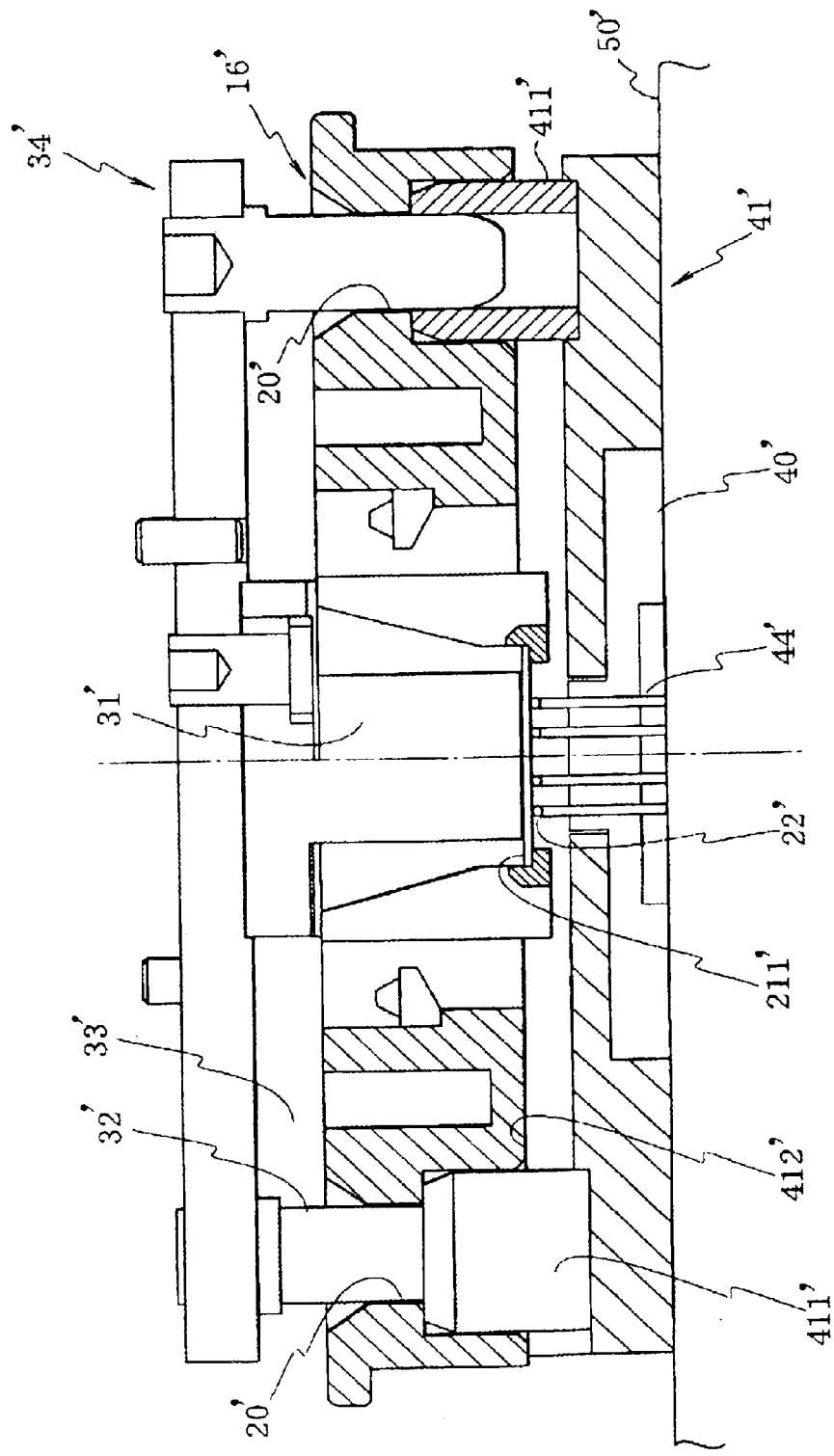
FIG. 23 is a partial cross sectional view of a state where the pusher is lowered in FIG. 22.
Figure 24:
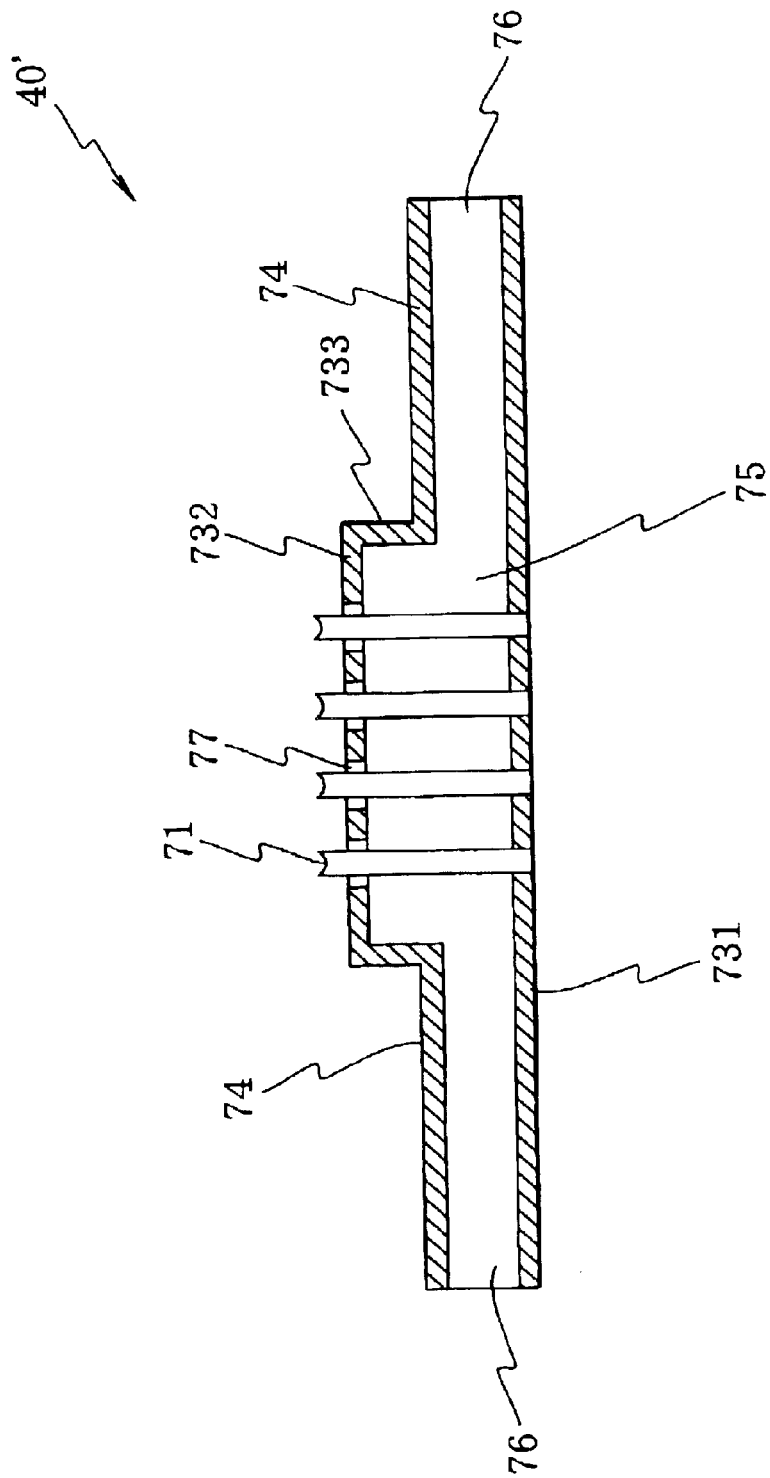
FIG. 24 is a cross sectional view of an IC socket (an embodiment of an electronic component testing socket according to the present invention) used in the IC testing apparatus.
Figure 25:
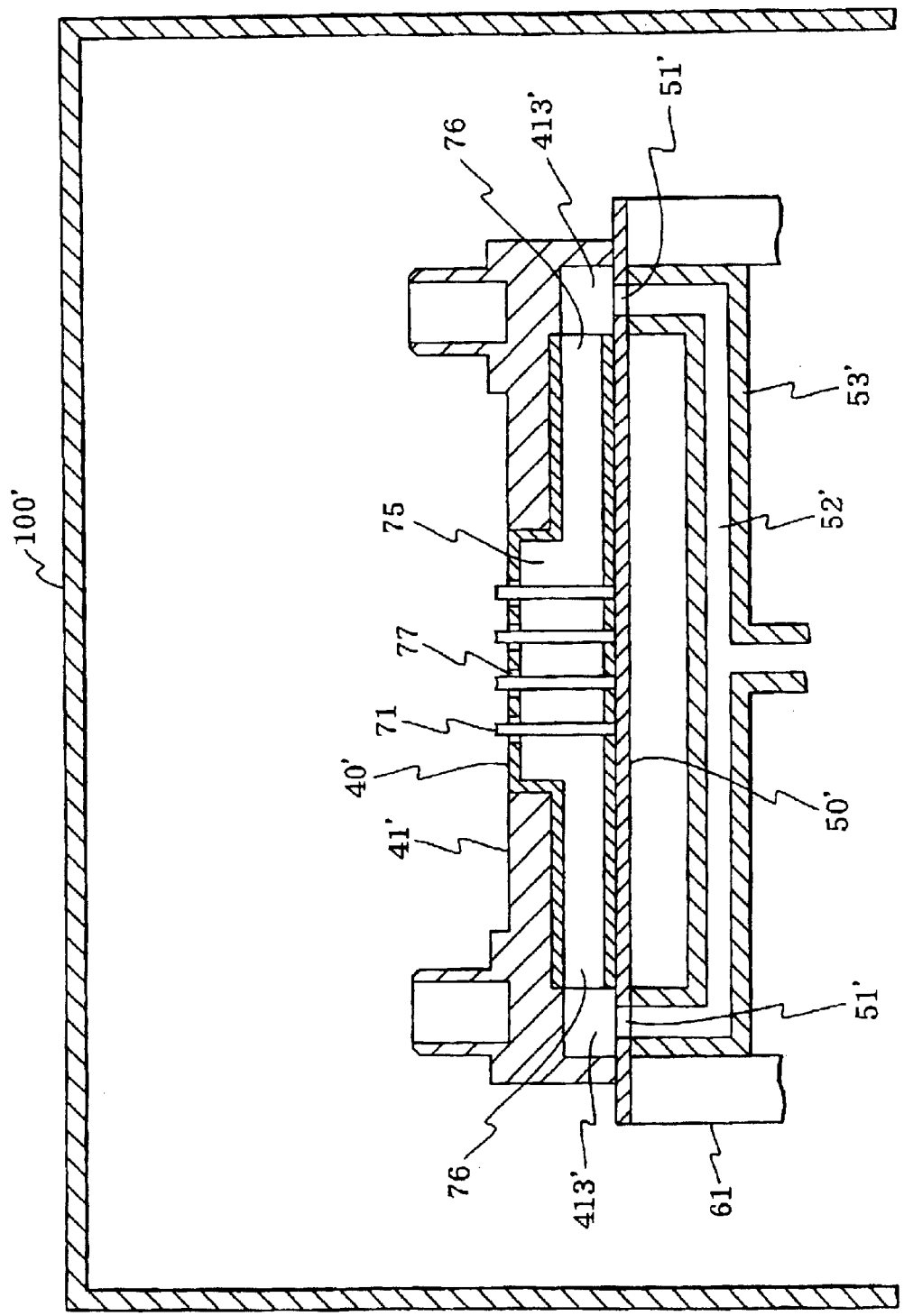
FIG. 25 is a partial sectional view of a temperature adjustment mechanism of the IC socket in the IC testing apparatus.

FIG. 13 is an overall view from the side of an IC testing apparatus according to an embodiment of an electronic component testing apparatus of the present invention, FIG. 14 is a perspective view of a handler in the IC testing apparatus, FIG. 15 is a flow chart of movement of a tray showing a method of handling an IC to be tested, FIG. 16 is a perspective view of the structure of an IC stocker in the IC testing apparatus, FIG. 17 is a perspective view of a customer tray used in the IC testing apparatus, FIG. 18 is a cross sectional view of important parts in a test chamber in the IC testing apparatus, FIG. 19 is a partially disassembled perspective view of a test tray used in the IC testing apparatus, FIG. 20 is a disassembled perspective view of the configuration around a socket in a test head of the IC testing apparatus, FIG. 21 is a disassembled perspective view of a pusher in the IC testing apparatus, FIG. 22 is a partial cross sectional view around the socket in the IC testing apparatus, FIG. 23 is a partial cross sectional view of a state where the pusher is lowered in FIG. 22, FIG. 24 is a cross sectional view of an IC socket (an embodiment of an electronic component testing socket according to the present invention) used in the IC testing apparatus, and FIG. 25 is a partial sectional view of a temperature adjustment mechanism of the IC socket in the IC testing apparatus.

Note that FIG. 15 is a view for understanding a method of handling an IC to be tested in an IC testing apparatus according to the present embodiment and partially shows by a plan view members actually arranged aligned in the vertical direction. Therefore, the mechanical (three-dimensional) structure will be explained with reference to FIG. 14.

First, an overall configuration of the IC testing apparatus according to the present embodiment will be explained.

As shown in FIG. 13, an IC testing apparatus 10' according to the present embodiment comprises a handler 1', a test head 5' and a testing main device 6'. The handler 1' performs an operation of successively conveying IC chips (an example of electronic components) as electronic components to be tested to sockets of a contact section 9' provided on top of the test head 5' and classifying the tested IC chips in accordance with test results to be stored on predetermined trays.

The socket of the contact section 9' is electrically connected to the testing main device 6' via the test head 5' and a cable 7', and an IC chip removably loaded on the socket is electrically connected to the testing main device 61 via the test head 5' and the cable 7'. A test electric signal is applied from the testing main device 6' to the IC chip loaded on the socket, a respond signal read from the IC chip is sent to the testing main device 6' though the cable 7', and thereby, performance and functions of the IC chip are tested.

Under the handler is arranged a built-in control unit for mainly controlling the handler 1' and a space 8' is also partially provided. The test head 5' is arranged in the space 8' so as to be able to be exchanged and capable of attaching and removing an IC chip to and from the socket of the contact section 9' provided thereon through a through hole formed on the handler 1'.

The IC testing apparatus 10' is an apparatus for testing IC chips as electronic components to be tested in a higher temperature state (high temperature) or a lower temperature state (low temperature) than an ordinary temperature, wherein the handler 1' comprises a chamber composed of a constant temperature chamber 101', a test chamber 102' and a soak chamber 103' as shown in FIG. 14 and FIG. 15. The contact section 9' provided on top of the test head 5' shown in FIG. 13 is inserted to the test chamber 102' as shown in FIG. 18 where a test is conducted on the IC chips.

As shown in FIG. 14 and FIG. 15, the handler 1' in the IC testing apparatus 10' is comprised of an IC magazine 200' for holding IC chips to be tested or classifying and storing tested IC chips, a loader section 300' for sending the IC chips sent from the IC magazine 200' to a chamber section 100', a chamber section 100' including the test head 5', and an unloader section 400' for classifying tested IC chips which had been tested in the chamber section 100'. Note that the IC chips are carried on the test tray to be conveyed inside the handler 1'.

A large number of IC chips before being carried on the handler 1' are stored on the customer tray KST shown in FIG. 17, supplied to the IC magazine 200' of the handler 1' shown in FIG. 14 and FIG. 15 in that state, and reloaded from the customer tray KST to a test tray TST (see FIG. 19) conveyed through the inside of the handler 1'. Inside the handler 1', as shown in FIG. 15, the IC chips are moved in the state of being carried on the test tray TST, given a thermal stress of a high temperature or a low temperature, subjected to a test (inspection) whether they are operating suitably or not, and classified in accordance with the test results. Below, inside of the handler 1' will be respectively explained in detail.

First, a portion relating to the IC magazine 200' will be explained.

As shown in FIG. 14, the IC magazine 200' is provided with a pre-test IC stocker 201' for carrying IC chips to be tested and a tested IC stocker 202' for storing IC chips classified in accordance with test results.

The pre-test IC stocker 201' and the tested IC stocker 202', as shown in FIG. 16, are each comprised of a frame-shaped tray support frame 203 and an elevator 204' able to enter from under the tray support frame 203 and move toward the top. The tray support frame 203' supports in it a plurality of stacked customer trays KST, and only the stacked customer trays KST are moved up and down by the elevator 204'.

The pre-test IC stocker 201' holds stacked customer trays KST on which the IC chips to be tested are held. While, the pre-test IC stocker 202' holds stacked customer trays KST on which IC chips finished being tested are suitably classified.

Note that since the pre-test IC stocker 201' and the post-test IC stocker 202' are structured approximately the same, some of the pre-test IC stocker 201' can be used as the tested IC stocker 202', inversely, some of the tested IC stocker 202' can be used as the tested IC stocker 202'. Accordingly, the numbers of the pre-test stocker 201' and the post-test stocker 202' may be easily changed in accordance with need.

As shown in FIG. 14 and FIG. 15, in the present embodiment, two stockers STK-B are provided as the pre-test IC stocker 201'. Next to the stockers STK-B are provided two empty stockers STK-E as the tested IC stocker 202' to be sent to the unloader section 400'. Further next to them, eight stockers STK-1, STK-2, . . . , STK-8 are provided as the tested IC stocker 202' and can hold IC chips sorted into a maximum of eight classes according to the test results. That is, in addition to classifying IC chips as good and defective, it is possible to divide the good IC chips into ones with high operating speeds, ones with medium speeds, and ones with low speeds and the defective IC chips into ones requiring retesting etc.

Secondary, a portion relating to the loader section 300' will be explained.

The customer tray KST kept in the tray support frame 203' of the pre-test IC stocker 201' shown in FIG. 16 is, as shown in FIG. 14, conveyed from the lower side of the test board 105' to an opening 306' of the loader section 300' by a tray transfer arm 205' provided between the IC magazine 200' and test board 105'. Further, in the loader section 300', the IC chips loaded on the customer tray KST are transferred once to a preciser 305' by an X-Y conveyer 304'. There, the mutual positions of the IC chips are corrected, then the IC chips transferred to the preciser 305' are reloaded on the test tray TST stopped at the loader section 300' using the X-Y conveyer 304' again.

The X-Y conveyer 304' reloading the IC chips from the customer tray KST to the test tray TST, as shown in FIG. 14, is provided with two rails 301' laid over the top of the test board 105', a movable arm 302' able to move back and forth (this direction designated as the Y-direction) between the test tray TST and a customer tray KST by these two rails 301', and a movable head 303' supported by the movable arm 302' and able to move in the X-direction along the movable arm 302'.

The movable head 303' of the X-Y conveyer 304' has suction heads attached facing downward. The suction heads move while drawing out air to pick up the IC chips from the customer tray KST and reload the IC chips on the test tray TST. For example, about eight suction heads are provided for the movable head 303', so it is possible to reload eight IC chips at one time on the test tray TST.

Thirdly, a portion relating to the chamber 100' will be explained.

The above test tray TST is loaded with the IC chips to be tested in the loader section 300' and then conveyed to the chamber section 100'. The IC chips are tested in the chamber section 100' in the state being carried on the test tray TST.

As shown in FIG. 14 and FIG. 15, the chamber section 100' comprises a constant temperature chamber 101' for giving a desired high temperature or low temperature thermal stress to the IC chips to be tested carried on the test tray TST, a test chamber 102' for making the IC chips contact the test head 104' in a state given the thermal stress by the constant temperature chamber 101' and a soak chamber 103' for removing the given thermal stress from the IC chips tested in the test chamber 102'.

In the soak chamber 103', when a high temperature was applied in the constant temperature chamber 101', the IC chips to be tested are cooled by blowing in air to return to room temperature. Alternately, when a low temperature has been applied in the constant temperature chamber 101', it heats the IC chips by hot air or a heater etc. to return them to a temperature where no condensation occurs. Next, the thus treated IC chips are conveyed out to the unloader section 400'.

As shown in FIG. 14, the constant temperature chamber 101' and soak chamber 103' of the chamber section 100' are arranged so as to project upward from the test chamber 102'. Further, the constant temperature chamber 101' is provided with a vertical conveyer as shown schematically in FIG. 15. A plurality of test tray TST stand by supported by the vertical conveyer until the test chamber 102' becomes empty. Mainly while standing by, a high temperature or low temperature thermal stress is applied to the IC chips.

As shown in FIG. 18, the test chamber 102' has a test head 5' arranged at its center, where all IC chips 2' held by the test tray TST shown in FIG. 19 are simultaneously or successively brought to be electrically in contact with the test head 5' and all IC chips 2' in the test tray TST are tested. On the other hand, the test tray TST finished being tested is treated in the soak chamber 103' to return the temperature of the IC chips 2' to a room temperature, and then is discharged to the unloader section 400' shown in FIG. 14 and FIG. 15.

As shown in FIG. 14, at an upper potion of the constant chamber 101' and the soak chamber 103', an inlet opening for sending the test tray TST from the test board 105' and an outlet opening for sending the test tray TST out to the test board 105' are formed, respectively. The test board 105' is mounted test tray conveyers 108' for taking in and out the test tray TST to and from the openings. The conveyers 108' are comprised of for example a rotation roller. The test tray TST discharged from the soak chamber 103' by the test tray conveyer 108' provided on the test board 105' is returned to the constant temperature chamber 101' through the unloader section 400' and the loader section 300'.

FIG. 19 is a disassembled perspective view of the structure of a test tray TST used in the present embodiment. The test tray TST comprises a rectangular frame 12' provided with a plurality of crosspieces 13' in parallel at equal intervals. A plurality of mounting pieces 14' formed projecting out in a longitudinal direction at equal intervals are formed respectively at two sides of the crosspieces 13' and inside of the sides 12a of the frame 12' in parallel with the crosspieces 13'. Respective insert holders 15' are comprised between these crosspieces 13', and two facing mounting pieces 14' in the plurality of mounting pieces 14' provided between the crosspieces 13' and the sides 12a'.

The insert holders 15' are designed to receive one insert 16 each. An insert 16' is attached to the two mounting pieces 14' in a floating state using fastener 17'. For example, about 16×4 of these inserts 16' are provided in one test tray TST. By putting the IC chips 2' to be tested in the inserts 16', the IC chips are loaded on the test tray TST. Note that the IC chips to be tested in the present embodiment are, as shown in FIG. 22 and FIG. 23, so called BGA type IC chips wherein solder balls as the external terminals 22' are arranged in matrix on the lower surface of the rectangular body 21'. Note that the electronic component as an object of the test of the electronic component testing apparatus according to the present invention is not limited to this.

The insert 16' of the present embodiment is formed a rectangular IC magazine 19' for putting in the IC chip 2' as shown in FIG. 20 and FIG. 21. The lower end of the IC magazine 19' is opened so that the external terminal 22' of the IC chip 2' is exposed and an IC holder 195' for holding the IC chip 2' is provided on the circumferential portion of the opening.

At the center of both sides of the insert 16' are formed a guide hole 20' to be inserted a guide pin 32' of the pusher base 34' and a guide bush 411' of a socket guide 41' respectively from the above and under, and at the corners of the both sides of the insert 16' are formed a mounting hole 21' for the mounting piece 14' of the test tray TST.

As shown in FIG. 22 and FIG. 23, the guide hole 20' is a hole for alignment. For example, assuming that the guide hole 20' on the left side in the drawings is a hole for alignment and has a smaller inside diameter than that of the guide hole 20' on the right side, the guide hole 20' on the left is inserted to its upper half a guide pin 32' of the pusher base 34' and alignment is performed, while a guide bush 411' of the socket guide 41' is inserted to its lower half for performing alignment. On the other hand, the guide hole 20' on the right side in the drawing and the guide pin 32' and the guide bush 411' of the socket guide 41' are in a loosely fitted state.

As shown in FIG. 20, a socket board 50' is arranged on top of the test head 5'. The socket board 50' can be arranged for the number corresponding to the IC chips to be tested arranged in four rows in total in every four lines in the line direction (4 lines×4 rows) on the test tray TST shown in FIG. 19. If a size of each socket board 50' can be made smaller, the socket board 50' may be arranged for 4 lines×16 rows on the test head 5' so that all IC chips 2' held on the test tray TST shown in FIG. 19 can be tested at one time.

As shown in FIG. 20, an IC socket 40' is provided on the socket board 50', and as shown in FIG. 22 and FIG. 23, a socket guide 41' is fixed to the IC socket 40' so that a probe pin 44' (an example of a connection terminal of an electronic component testing socket) provided to the IC socket 40' is exposed.

The probe pins 44' of the socket 40' are provided for the number and positions corresponding to the external terminals 22' of the IC chips 2' and biased in the upward direction by not shown springs. On the both sides of the socket guide 41' are provided guide bushes 411' to which two guide pins 32' formed on the pusher base 34' are inserted and alignment is performed.

A cross sectional view of an IC socket 40' as an embodiment of an electronic component testing socket according to the present invention is shown in FIG. 24. Note that FIG. 24 is a cross sectional view corresponding to FIG. 11(*c*) wherein parts and portions corresponding to those in the electronic component testing socket 7E are added same reference numbers, and explanations thereon will be omitted except for necessary cases.

The IC socket 40' has gas inlets 76 connected to the socket body inside space 75 provided on a flat plate section 74 and spaces as gas outlets 77 between upper plate sections 732 of a connection terminal holder 73 and connection terminals 71.

The socket guide 41', as shown in FIG. 25, comprises a gas flow path 413' connecting the gas inlet 76 of the IC socket 40' and the gas inlet 51' of the socket board 50'.

The gas inlet 51' of the socket board 50' is, as shown in FIG. 25, connected to a gas flow path 52' provided below the socket board 50'. The gas flow path 52' is formed by a pipe 53' attached to a gas supplier (not shown) arranged inside the chamber 100'. The gas supplier is capable of supplying a thermoregulated gas in the chamber 100' to the socket body inside space 75 through the gas flow path 52'. The gas supplier preferably comprises a mechanism to adjust the temperature of the gas in the chamber 100' in accordance with need for supplying. It is because if a temperature sensor is arranged near the IC socket 40', a gas whose temperature is adjusted in accordance with a temperature change near the IC socket 40' can be supplied to the socket body inside space 75.

The thermoregulated gas in the chamber 100' supplied by the gas supplier flows into the socket body inside space 75 via the gas flow path 52', the gas inlet 51' of the socket board 50', the gas flow path 413' of the socket guide 41' and the gas inlet 76 of the IC socket 40' and flows out from the gas outlet of the IC socket 40'. As a result, the temperature of the IC socket 40' can be efficiently controlled by using the thermoregulated gas in the chamber 100'.

The pipe 53' may be attached to a gas supplier (not shown) arranged outside the chamber 100'. The gas supplier to be used in this case is capable of supplying a thermoregulated gas to the socket body inside space 75 through the gas flow path 52' and also capable of controlling the temperature of the IC socket 40' based on the same mechanism as explained above.

Also, the pipe 53' may be attached to a gas aspirator (not shown). The gas aspirator to be used in this case is capable of aspirating the gas in the socket body inside space 75 of the IC socket 40' through the gas flow path 52'. When the gas in the socket body inside space 75 is aspirated by the gas aspirator, the thermoregulated gas in the chamber 100' is flown from a space (a gas inlet) between the upper plate section 732 of the connection terminal holder 73 of the IC socket 40' and the connection terminal 71. As a result, the temperature of the IC socket 40' can be efficiently controlled by using the gas in the chamber 100'.

In the present embodiment, in the chamber 100' configured as explained above, as shown in FIG. 18, a thermoregulating ventilator 90' is mounted in an airtight casing 80' composed in the test chamber 102'. The thermoregulating ventilator 90' comprises a fan 91' and a heat exchanger 94', inhales an air in the casing by the fan 92' and blows into the casing 80' through the heat exchanger 94', so that inside the casing 80' becomes a predetermined temperature condition (a high temperature or low temperature).

The heat exchanger 94' of the thermoregulating ventilator 90' is comprised of a heat releasing heat exchanger wherein a heating medium flows or an electric heater, etc. when making inside the casing to be a high temperature, so that a sufficient heat for maintaining inside the casing at a high temperature of for example a room temperature to 160° C. or so can be provided. While when making inside the casing to be a low temperature, the heat exchanger 94' is comprised of an absorbing heat exchanger wherein a refrigerant, such as liquid nitrogen, circulates, etc. so that sufficient heat can be removed for maintaining inside the casing to be a low temperature of for example −60° C. to a room temperature. The temperature inside the casing 80' is detected for example by a temperature sensor 82' and an air flow of the fan 92' and a heat amount of the heat exchanger 94', etc. are controlled to maintain inside the casing 80' to be a predetermined temperature.

A warm wind or cold wind generated through the heat exchanger 94' of the thermoregulating ventilator 90' is flown over the casing 80' along the Y-axial direction, flows down along a sidewall of the casing on the opposite side from the apparatus 90', returns to the apparatus 90' through a space between a match plate 60' and the test head 5' and circulates inside the casing.

The pusher 30' shown in FIG. 21 is provided on top of the test head 5' for the number corresponding to the number of socket 40'. As shown in FIG. 18, each of the pushers 30' is elastically held by the match plate 60'. The match plate 60' is mounted so as to be positioned above the test head 5' and that the test tray TST can be inserted between the pusher 30' and the socket 40'. The pusher 30' held by the match plate 60' is freely movable in the Z-axial direction with respect to the test head 5' a drive plate (driver) 72' of the Z-axis drive 70'. Note that the test tray TST is conveyed from a vertical direction (X-axis) with respect to the paper surface in FIG. 18 to between the pusher 30' and the socket 40'. A means for transferring the test tray TST inside the chamber 100' uses a conveying roller, etc. At the time of conveying the test tray TST, a drive plate of the Z-axial drive 70' is elevated along the Z-axial direction and a sufficient space for being inserted the test tray TST is formed between the pusher 30' and the socket 40'.

As shown in FIG. 18, on the lower surface of the drive plate 72' arranged inside the test chamber 102' is fixed pressing sections 74' for the number corresponding to that of the pushers 30' so that the upper surface of the pusher 30' (an upper surface of a lead pusher base 35) held by the match plate 60' can be pressed against. A drive axis 78' is fixed to the drive plate 72' and the drive axis 78' is connected to a drive source (not shown), such as a motor, so that the drive axis 78' can vertically move along the Z-axial direction and can press the pusher 30'.

Note that the match plate 60' is configured to be able to be exchanged together with the pusher 30' in accordance with a shape of IC chips 2' to be tested, the number of sockets of the test head 5' (the number of IC chips 2' to be inspected at one time), etc. By making the match plate 60' be able to be exchanged, the Z-axis drive 70' can be widely used. In the present embodiment, the pressing section 74' and the pusher 30' are in one to one correspondence, but for example when the number of sockets of the test head 5' is changed to be half, the pressing section 74' and the pusher 30' can be in two to one correspondence by exchanging the match plate 60'.

As shown in FIG. 21, the pusher 30' comprises a lead pusher base 35' which is attached to the above Z-axis drive and moves vertically along the Z-axis direction, a pusher base 34', a pusher block 31' attached to the pusher base 34', and a spring 36' provided between the lead pusher base 35' and the pusher block 31'.

The lead pusher base 35' and the pusher base 34' are fixed by a bolt as shown in FIG. 21, and on both sides of the pusher base 34' are provided a guide pin 32' to be inserted to the guide hole 20' of the insert 16' and to the guide bush 411' of the socket guide 41'. Furthermore, the pusher base 34' is provided with a stopper guide 33' for regulating a lower limit at the time of lowering the pusher base 34' by the Z-axis drive means. A reference size of a lower limit position of the pusher 30' is determined by the stopper guide 33' coming to contact a stopper surface 412', and thereby the pusher 30' can press the IC chip 2' loaded on the socket 40' with a suitable pressure that prevents any damage.

As shown in FIG. 21, the pusher block 31' is inserted to a through hole formed at the center of the pusher base 34', and a spring 36' and, in accordance with need, a sym 37' are provided between the pusher block 31' and the lead pusher base 35'. The spring 36' is a compression spring for biasing the pusher block 31' in the direction of pressing the IC chip 2' loaded on the socket 40' (the downward direction in FIG. 22 and FIG. 23) and has an elasticity coefficient in accordance with a reference load on the IC chip 2'.

The sym 37' is for adjusting a reference length of the spring 36' in a state of being attached and adjusting an initial load to be affected on the pusher block 31'. That is, even when using the spring 36' having the same elasticity coefficient, the initial load affecting on the pusher block 31' becomes large by providing the sym 37'. Note that in FIG. 21, the sym 37' is provided between the spring 36' and the pusher block 31', but it may be provided between the pusher base 35' and the spring 36' since it is sufficient if the reference length of the spring 36' can be adjusted.

To connect the external terminal 22' of the IC chip to be tested 2' to the probe pin 44 of the socket 40', as shown in FIG. 22, the IC chip 2' is put in the IC magazine 19' of the insert 16', the IC holder 195' holds the circumferential portion of the lower surface (a surface provided with the external terminal 22') of the body 21' of the IC chip 2', and the external terminal 22' of the IC chip 2' is exposed from the opening at the lower end of the IC magazine 19'.

By mounting the insert 16' carrying the IC chips 2' as above onto the socket guide 41', the IC chips 2' are loaded on the socket 40'. Then, the pusher block 31' of the pusher 30', as shown in FIG. 23, presses the body 21' of the IC chip 2' against the socket 40', as a result, the external terminal 22' of the IC chip 2' is connected to the probe pin 44' of the socket 40'. At this time, the probe pin 44' of the socket 40' is retreated into the socket 40' while being biased by the spring in the upward direction, but the end of the probe pin 44' slightly pokes the external terminal 22'.

Fourthly, a portion relating to the unloader section 400' will be explained.

The unloader section 400' shown in FIG. 14 and FIG. 15 is provided with X-Y conveyers 404' of the same structure as the X-Y conveyers 304' provided to the loader section 300'. The X-Y conveyers 404' reload the post-test IC chips from the test tray TST carried out to the unloader section 400' to the customer tray KST.

As shown in FIG. 14, the board 105' of the unloader section 400' is provided with two pairs of openings 406' arranged so that the customer trays KST carried to the unloader section 400' can be brought close to the top surface of the board 105'.

While not illustrated, an elevator table for elevating or lowering a customer tray KST is provided below the openings 406'. A customer tray KST becoming full after being reloaded with the tested IC chips is placed on here and lowered and the full tray is passed to the lower tray magazine of the tray transfer arm 205'.

In an IC testing apparatus 10' according to the second embodiment, for example, the following modifications are possible.

Figure 26:
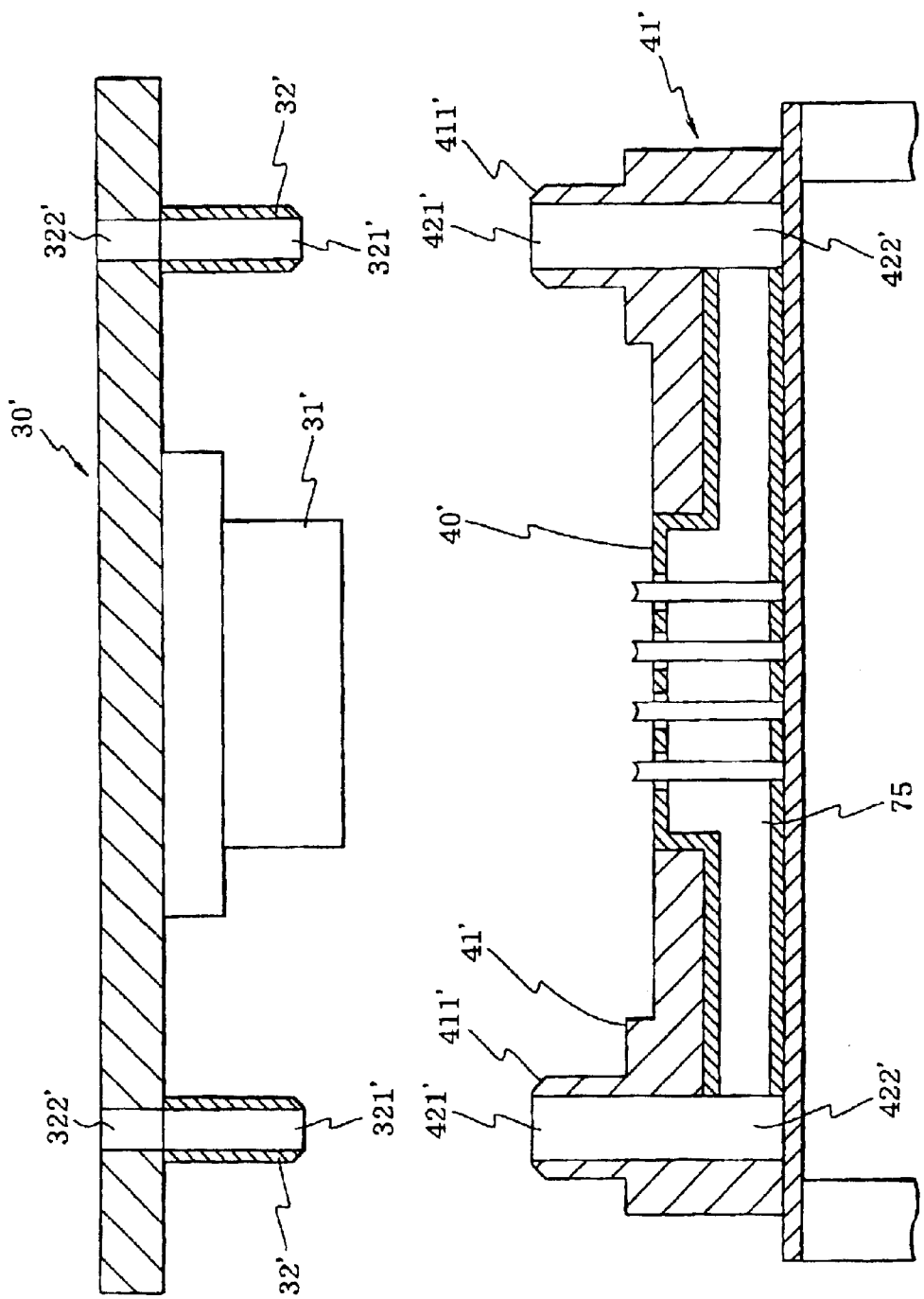
FIG. 26 is a partial cross sectional view of another temperature adjustment mechanism of the IC socket.

As shown in FIG. 26, a gas inlet 421' can be provided to an end of the guide bush 411' of the socket guide 41' and a gas flow path 422' for connecting the gas inlet 421' and the socket body inside space 75 can be provided to inside the socket guide 41'. Also, a gas outlet 321' can be provided to the end of the guide pin 32' of the pusher 30' and a gas flow path 322' connecting to the gas outlet 321' can be provided inside the pusher 30'. Furthermore, it is possible not to provide the gas inlet 51' to the socket board 50'.

Figure 27:
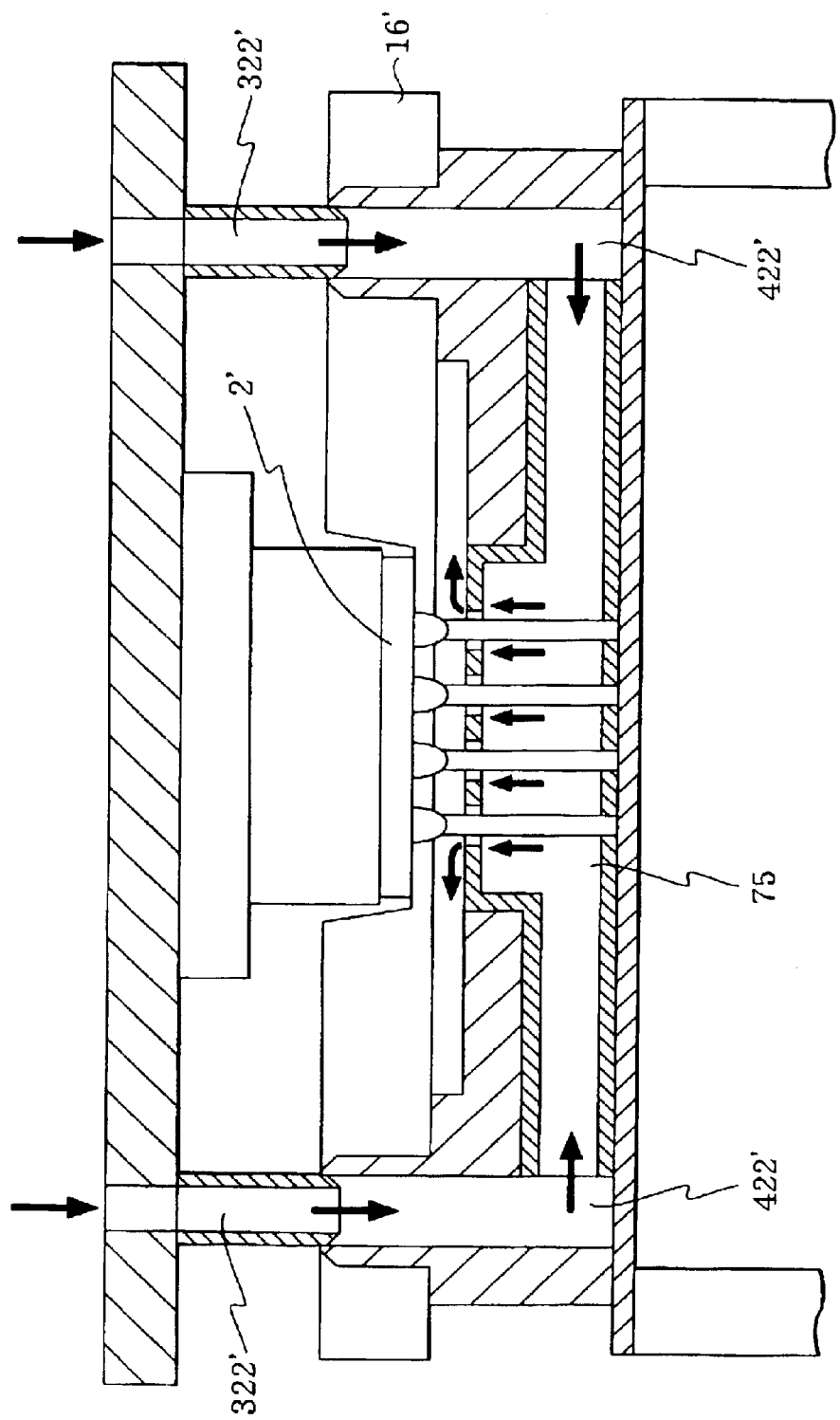
FIG. 27 is a partial cross sectional view of a flow path of a thermoregulated gas flown into the IC socket.

By making such modifications on the socket guide 41', pusher 30' and socket board 50', as shown in FIG. 27, in a state that the guide bush 411' of the socket guide 41' and the guide pin 32' of the pusher 30' are fit, the gas flow path 322' of the pusher 30' becomes connected to the socket body inside space 75 through the gas flow path of the socket guide 41. Accordingly, by supplying a thermoregulated gas to the gas flow path 322' of the pusher 30' by using a gas supplier, the thermoregulated gas can be flown into the socket body inside space 75 and the temperature of the IC socket 40' can be controlled. Note that the thermoregulated gas supplied to the gas flow path 322' of the pusher 30' flows as indicated by arrows in FIG. 27. The thermoregulated gas to be supplied to the gas flow path 322' of the pusher 30' may be either a thermoregulated gas inside or outside the chamber 100'.

Also, a gas in the socket body inside space 75 can be aspirated through the gas flow path 322' of the pusher 30'. When aspirating the gas in the socket body inside space 75 through the gas flow path 322' of the pusher 30', the gas inlet 421' of the socket guide 41' becomes a gas outlet, the gas outlet 321' of the pusher 30' becomes a gas inlet, and the gas outlet 77 of the IC socket 40' becomes a gas inlet, so that the thermoregulated gas in the chamber 100' can be flown to the socket body inside space 75 from a space between the upper plate section 732 of the connection terminal holder 73 of the IC socket 40' and the connection terminal 71', consequently, the temperature of the IC socket 40' can be controlled. Note that in the case of aspiration, the thermoregulated gas flows in the reverse direction of the arrows in FIG. 27.

Figure 28:
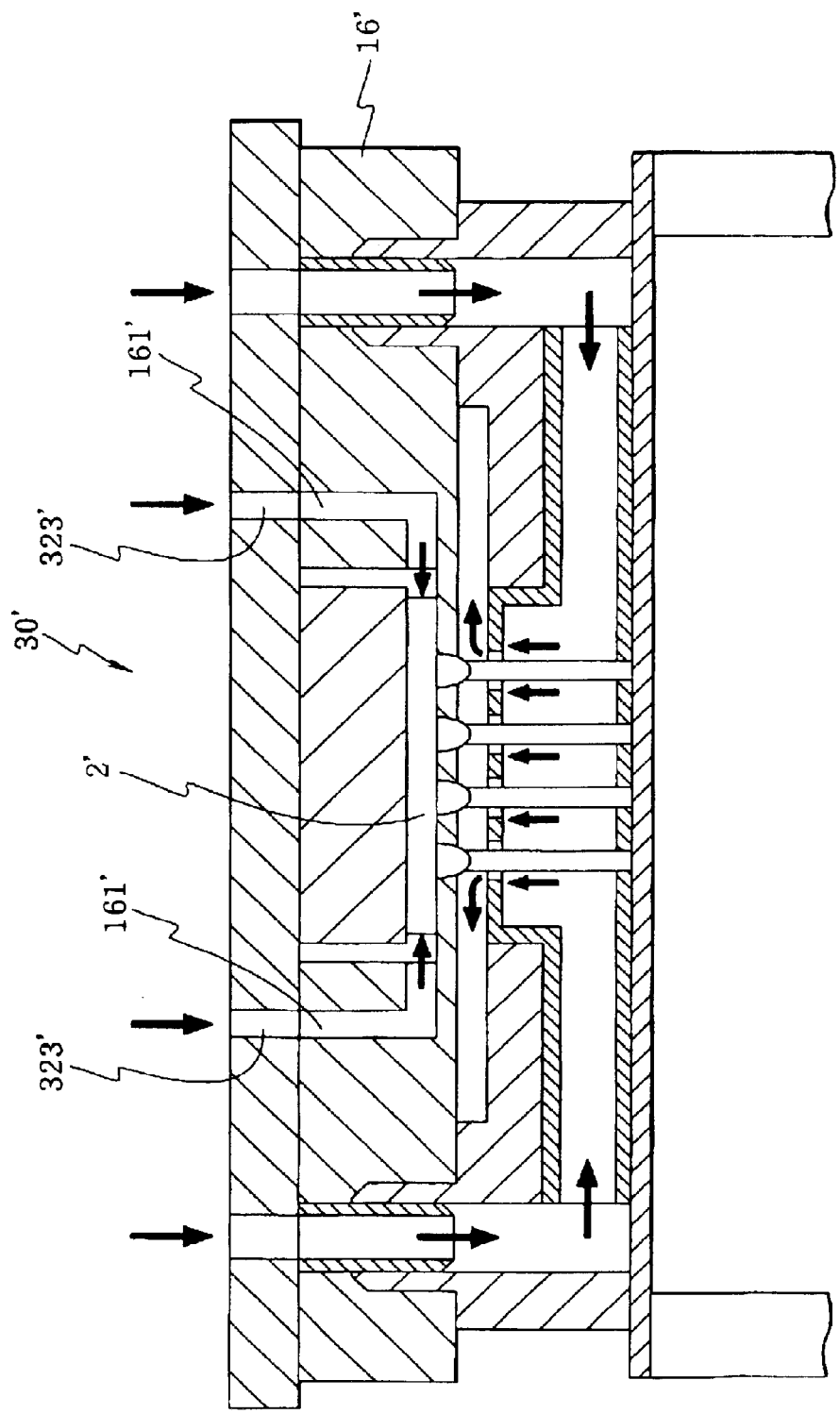
FIG. 28 is a partial sectional view of a temperature adjustment mechanism of the IC socket and the IC chip.

Furthermore, as shown in FIG. 28, a gas flow path 161' can be provided to the insert 16' and a gas flow path 323' can be provided to the pusher 30'. The gas flow paths 161' and 323' are provided so as to be connected when the guide bush 411' of the socket guide 41' and the guide pin 32' of the pusher 30' are fit. By supplying a thermoregulated gas from the gas flow path 323' of the pusher 30' in the state that the gas flow paths 161' and 323' are connected, the thermoregulated gas can be blown to the IC chip 2' and thereby temperature of the IC socket 40' and temperature of the IC chip 2' can be controlled. Note that at this time, the thermoregulated gas flows in the reverse direction of the arrows in FIG. 28.

Also, the thermoregulated gas in the chamber can be blown to the IC chip 2' also by aspirating the gas from the gas flow path 323' of the pusher 30'. The temperature of the IC socket 40' and that of the IC chip 2' can be also controlled in this case. Note that at this time, the thermoregulated gas flows in the reverse direction of the arrows in FIG. 28.

Note that the embodiments explained above were described to facilitate the understanding of the present invention and not to limit the present invention. Accordingly, elements disclosed in the above embodiments include all design modifications and equivalents belonging to the technical field of the present invention.

According to the electronic component testing socket, electronic component testing socket base, electronic component testing unit, electronic component testing apparatus and a method of controlling the temperature of the electronic component testing socket, the temperature of the electronic component testing socket can be controlled without mixing any noise into a test signal to be applied to an electronic component and a respond signal to be read from the electronic component when conducting a test on the electronic component by using a thermoregulated gas (for example, a heated or cooled gas). As a result, it is possible to prevent a reduction of a thermal stress given to the electronic component which may occur at the time of loading electronic components to be tested on the electronic component testing socket, and the contact credibility of the external terminal of the electronic component to be tested and the connection terminal of the electronic component testing socket can be assured.

What is claimed is:

1. An electronic component testing socket base, comprising a base body and a socket board provided on top of the base body, wherein the electronic component testing socket base is provided with a first space and a second space therein, the base body is provided with a gas inlet connected to the first space and a gas outlet connected to the second space, and the socket board is provided with a gas outlet connected to the first space and a gas inlet connected to the second space.

2. An electronic component testing socket base, comprising a base body and a socket board provided on top of the base body, wherein the electronic component testing socket base is provided with a space therein, the base body is provided with a gas inlet or a gas outlet connected to the space, and the socket board is provided with a gas outlet or a gas inlet connected to the space.

3. An electronic component testing unit comprising the electronic component testing socket base as set forth in claim 2 and an electronic component testing socket mounted on the socket board of the electronic component testing socket base, comprising a connection terminal able to be connected to an external terminal of an electronic component to be tested and a socket body for holding the connection terminal, wherein the socket body is provided with a gas inlet and a gas outlet connected to a space formed therein, and wherein the space formed inside the electronic component testing socket base and the space formed inside the electronic component testing socket are connected through the gas outlet provided on the socket board and the gas inlet provided on the socket body of the electronic component testing socket.

4. An electronic component testing unit comprising the electronic component testing socket base as set forth in claim 2 and an electronic component testing socket mounted on the socket board of the electronic component testing socket base, comprising a connection terminal able to be connected to an external terminal of an electronic component to be tested and a socket body for holding the connection terminal, wherein the socket body is provided with a gas inlet and a gas outlet connected to a space formed therein, and wherein the space formed inside the electronic component testing socket base and the space formed inside the electronic component testing socket are connected through the gas inlet provided on the socket board and the gas outlet provided on the socket body of the electronic component testing socket.

5. An electronic component testing unit comprising the electronic component testing socket base as set forth in claim 1 and an electronic component testing socket mounted on the socket board of the electronic component testing socket base, comprising a connection terminal able to be connected to an external terminal of an electronic component to be tested and a socket body for holding the connection terminal, wherein the socket body is provided with a gas inlet and a gas outlet connected to a space formed therein, and wherein the first space formed inside the electronic component testing socket base and the space formed inside the electronic component testing socket are connected through the gas outlet provided on the socket board and the gas inlet provided on the socket body of the electronic component testing socket, and the second space formed inside the electronic component testing socket base and the space formed inside the electronic component testing socket are connected through the gas inlet provided on the socket board and the gas outlet provided on the socket body of the electronic component testing socket.

6. An electronic component testing apparatus, comprising an electronic component testing unit as set forth in claim 3 and a gas supplier capable of supplying a thermoregulated gas from the gas inlet provided on the base body of the electronic component testing socket base of the electronic component testing unit to the space formed inside the electronic component testing socket base.

7. An electronic component testing apparatus, comprising a chamber, the electronic component testing unit as set forth in claim 3 arranged in the chamber and a gas supplier capable of supplying a gas in the chamber from the gas inlet provided on the base body of the electronic component testing socket base of the electronic component testing unit to the space formed inside the electronic component testing socket base.

8. An electronic component testing apparatus, comprising the electronic component testing unit as set forth in claim 4 and a gas aspirator capable of aspirating a gas in the space formed inside the electronic component testing socket base from the gas outlet provided on the base body of electronic component testing socket base of the electronic component testing unit.

9. An electronic component testing apparatus, comprising a chamber, the electronic component testing unit as set forth in claim 4 arranged in the chamber and a gas aspirator capable of aspirating a gas in the space formed inside the electronic component testing socket base from the gas outlet provided on the base body of the electronic component testing socket base of the electronic component testing unit.

10. An electronic component testing apparatus, comprising the electronic component testing unit as set forth in claim 5 and a gas supplier capable of supplying a thermoregulated gas from the gas inlet provided on the base body of the electronic component testing socket base of the electronic component testing unit to the first space fanned inside the electronic component testing socket base.

11. An electronic component testing apparatus, comprising a chamber, the electronic component testing unit as set forth in claim 5 arranged in the chamber and a gas supplier capable of supplying a gas in the chamber from the gas inlet provided on the base body of the electronic component testing socket base of the electronic component testing unit to the first space formed inside the electronic component testing socket base.

12. An electronic component testing apparatus, comprising an electronic component testing socket including a connection terminal able to be connected to an external terminal of an electronic component to be tested and a socket body for holding the connection terminal, the socket body provided with a gas inlet and a gas outlet connected to a space formed therein;

a socket guide provided to the electronic component testing socket;

a pusher capable of pushing an electronic component loaded on the electronic component testing socket in a direction of a connection terminal of the electronic component testing socket; and a gas supplier, wherein:

the socket guide has a gas inlet provided on the guide bush and a gas outlet connecting to the gas inlet through a gas flow path, the gas outlet of the socket guide is connected to the space formed inside the electronic component testing socket through the gas inlet provided on the socket body of the electronic component testing socket, the pusher has a gas outlet provided on the guide pin and a gas inlet connected to the gas outlet through a gas flow path, when the guide pin of the pusher fits in the guide bush of the socket guide, the gas inlet of the pusher and the space formed inside the electronic component testing socket are connected, and when the guide pin of the pusher fits in the guide bush of the socket guide, the gas supplier is capable of supplying a thermoregulated gas from the gas inlet of the pusher to the space formed inside the electronic component testing socket.

13. The electronic component testing apparatus as set forth in claim 12 further comprising a chamber, wherein the electronic component testing socket is arranged in the chamber and the gas supplier is capable of supplying a gas in the chamber from the gas inlet of the pusher to the space formed inside the electronic component testing socket.

14. An electronic component testing apparatus, comprising an electronic component testing socket including a connection terminal able to be connected to an external terminal of an electronic component to be tested and a socket body for holding the connection terminal, the socket body provided with a gas inlet and a gas outlet connected to a space formed therein:

a socket guide provided to the electronic component testing socket;

a pusher capable of pushing an electronic component loaded on the electronic component testing socket in a direction of connection terminal of the electronic component testing socket; and a gas aspirator, wherein:

the socket guide has a gas outlet provided on the guide bush and a gas inlet connected to the gas outlet through a gas flow path, the gas inlet of the socket guide is connected to the space formed inside the electronic component testing socket through the gas outlet provided on the socket body of the electronic component testing socket, the pusher has a gas inlet provided on the guide pin and a gas outlet connected to the gas inlet through a gas flow path, when the guide pin of the pusher fits in the guide bush of the socket guide, the gas outlet of the pusher is connected to the space formed inside the electronic component testing socket, and when the guide pin of the pusher fits in the guide bush of the socket guide, the gas aspirator is capable of aspirating a gas in the space formed inside the electronic component testing socket from the gas outlet of the pusher.

15. The electronic component testing apparatus as set forth in claim 14 further comprising a chamber, wherein the electronic component testing socket is arranged in the chamber.

* * * * *